United States Patent
Hao et al.

(10) Patent No.: US 9,305,688 B2
(45) Date of Patent: Apr. 5, 2016

(54) SINGLE PHOTOMASK HIGH PRECISION THIN FILM RESISTOR

(71) Applicant: Texas Instruments Incorporated, Dallas, TX (US)

(72) Inventors: PingHai Hao, Plano, TX (US); Fuchao Wang, Plano, TX (US); Duofeng Yue, Plano, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 174 days.

(21) Appl. No.: 14/046,177

(22) Filed: Oct. 4, 2013

(65) Prior Publication Data

US 2014/0184381 A1    Jul. 3, 2014

Related U.S. Application Data

(60) Provisional application No. 61/747,107, filed on Dec. 28, 2012.

(51) Int. Cl.
  *H01C 1/012*   (2006.01)
  *H01C 17/06*   (2006.01)
  *H01L 49/02*   (2006.01)
  *H01C 7/00*    (2006.01)
  *H01C 17/075*  (2006.01)

(52) U.S. Cl.
  CPC ............... *H01C 17/06* (2013.01); *H01L 28/24* (2013.01); *H01C 7/006* (2013.01); *H01C 17/075* (2013.01); *Y10T 29/435* (2015.01)

(58) Field of Classification Search
  CPC ........ H01C 1/012; H01C 17/06; H01C 7/006; H01C 17/075
  USPC .......................................... 338/306; 29/25.42
  See application file for complete search history.

(56) References Cited

U.S. PATENT DOCUMENTS

| | | | | |
|---|---|---|---|---|
| 5,479,316 | A  * | 12/1995 | Smrtic et al. ................... | 361/322 |
| 6,091,310 | A  * | 7/2000  | Utsumi et al. .................... | 333/12 |
| 6,426,268 | B1 * | 7/2002  | Huppert et al. ................ | 438/384 |
| 8,040,213 | B2 * | 10/2011 | Ashikaga ........................ | 338/314 |
| 8,754,741 | B2 * | 6/2014  | Williams et al. ............... | 338/308 |
| 2010/0073122 | A1 * | 3/2010 | Le Neel et al. .................. | 338/25 |
| 2010/0136764 | A1 * | 6/2010 | Dirnecker et al. ............. | 438/384 |
| 2010/0151651 | A1 * | 6/2010 | Beach ............................ | 438/382 |
| 2012/0292741 | A1 * | 11/2012 | Dalton et al. .................. | 257/536 |
| 2013/0341759 | A1 * | 12/2013 | Khan et al. ..................... | 257/533 |

* cited by examiner

*Primary Examiner* — Kyung Lee
(74) *Attorney, Agent, or Firm* — Jacqueline J. Garner; Frank D. Cimino

(57) ABSTRACT

An integrated circuit contains a thin film resistor in which a body of the thin film resistor is disposed over a lower dielectric layer in a system of interconnects in the integrated circuit. Heads of the thin film resistor are disposed over electrodes which are interconnect elements in the lower dielectric layer, which provide electrical connections to a bottom surface of the thin film resistor. Top surfaces of the electrodes are substantially coplanar with a top surface of the lower dielectric layer. A top surface of the thin film resistor is free of electrical connections. An upper dielectric layer is disposed over the thin film resistor.

11 Claims, 21 Drawing Sheets

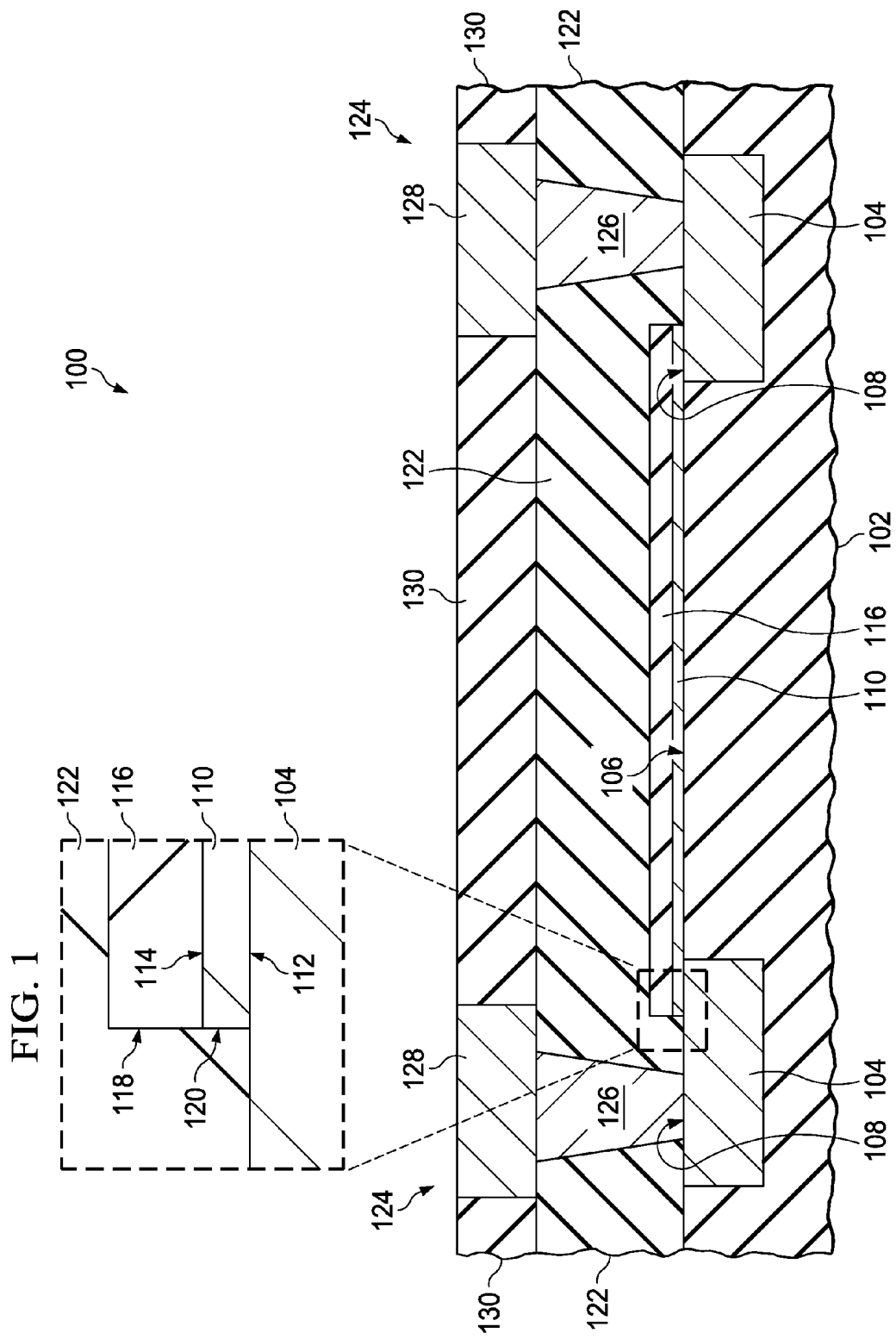

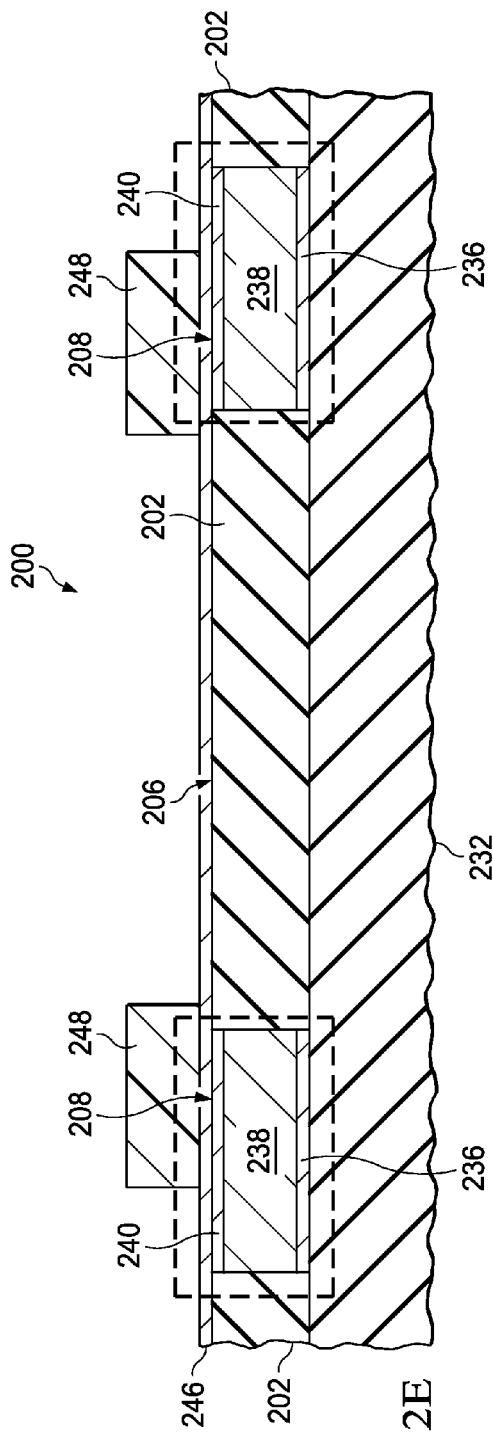
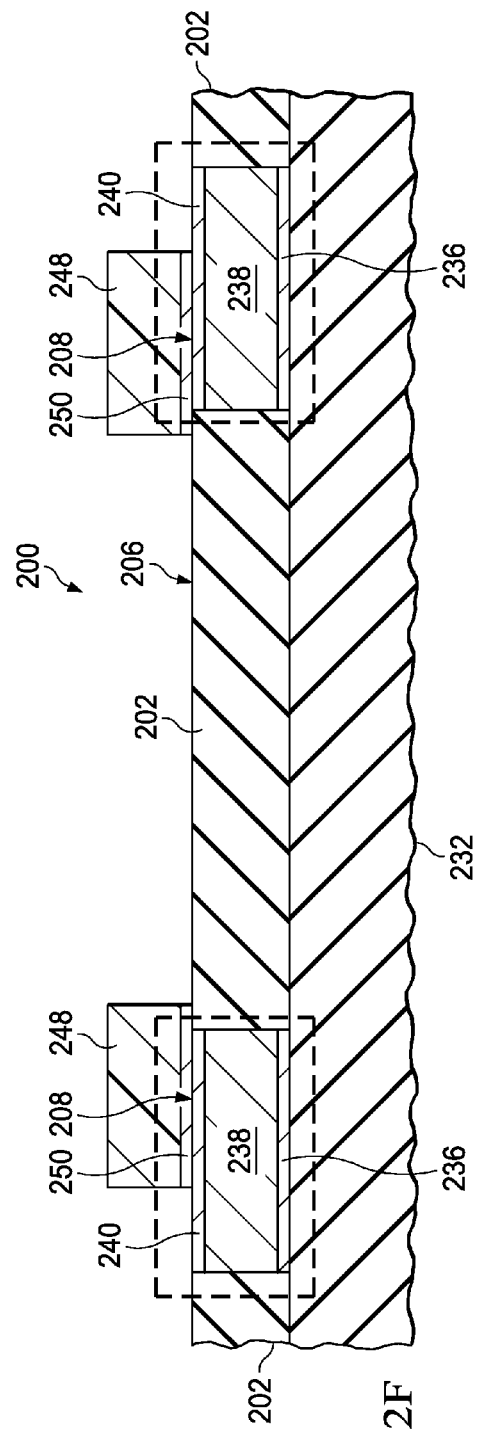
FIG. 2E
FIG. 2F

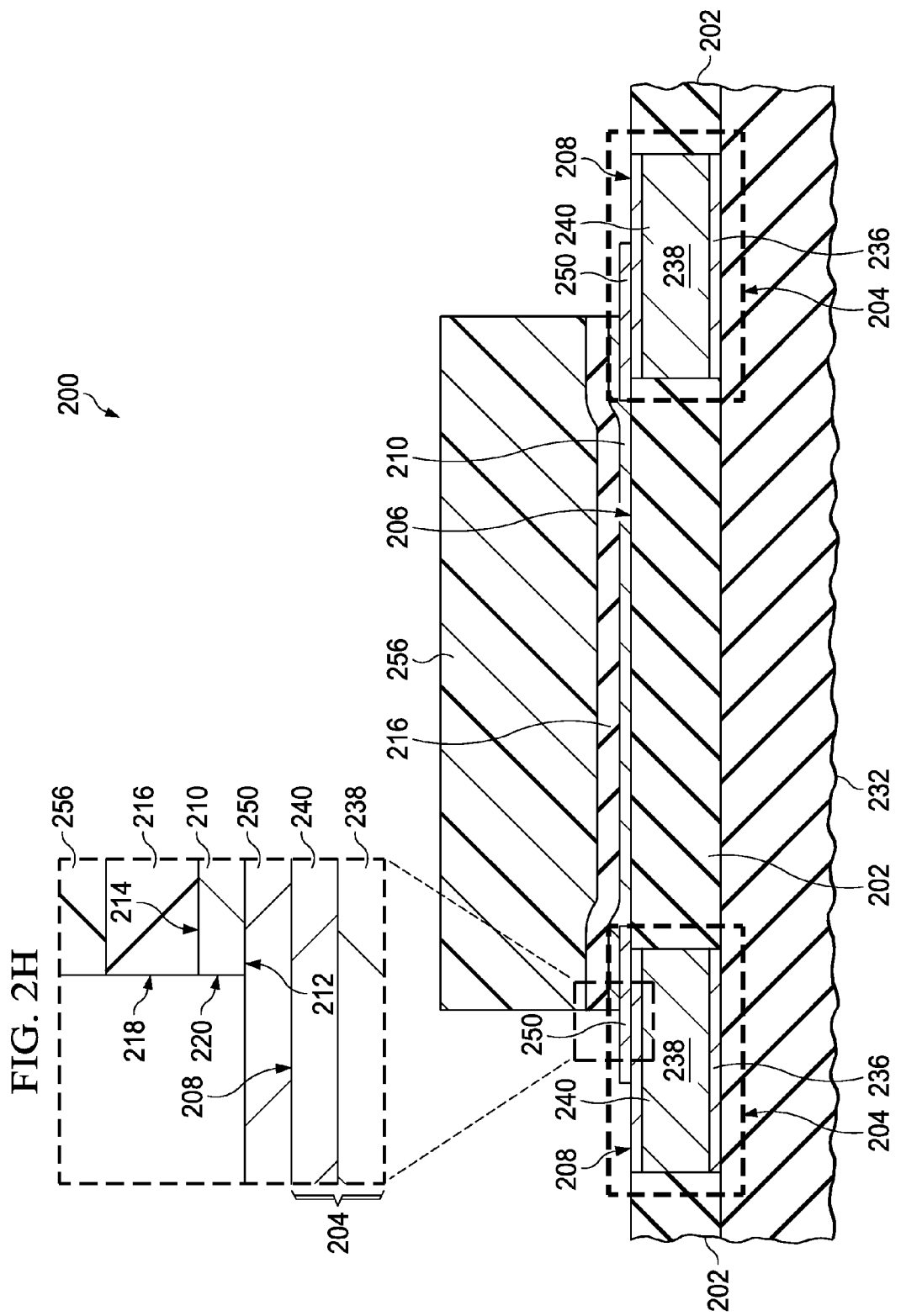

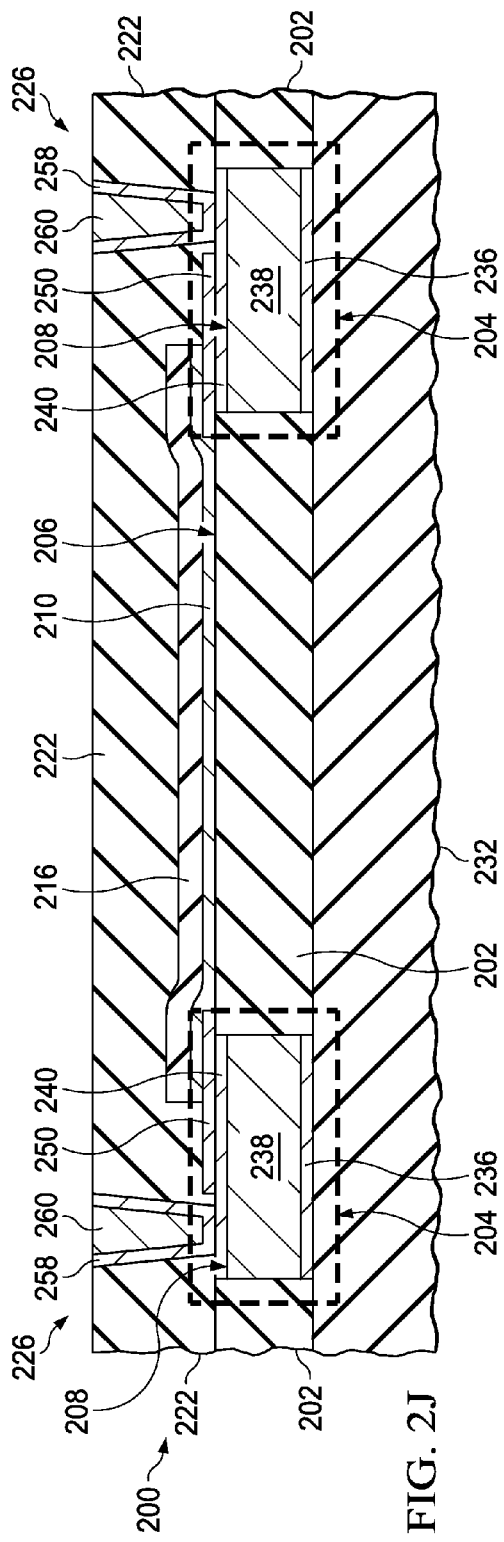
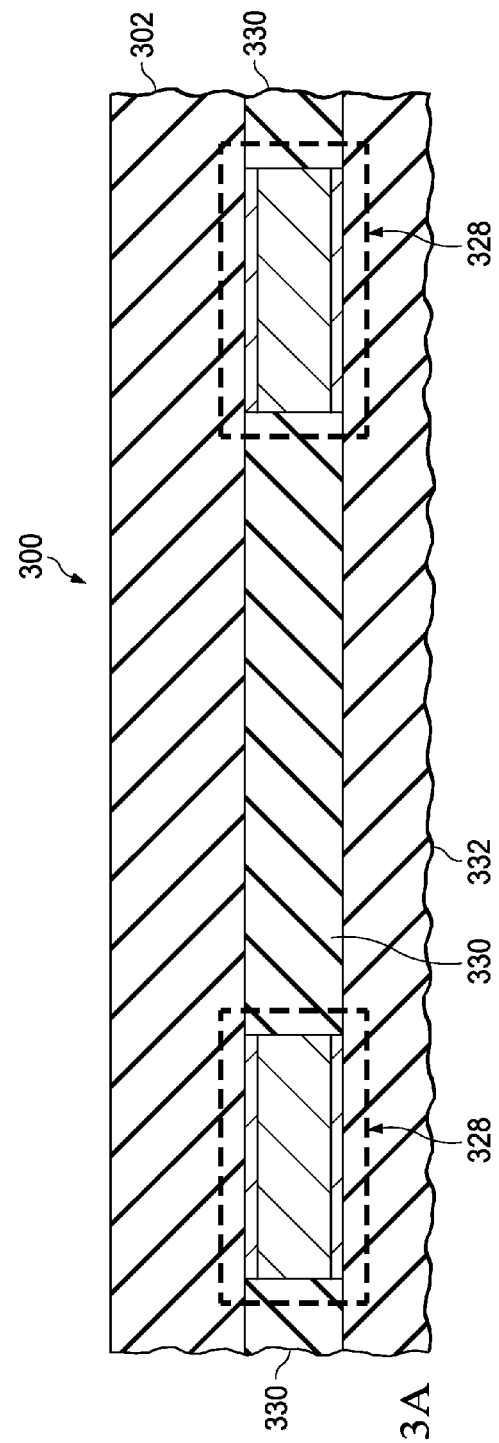
FIG. 2J
FIG. 3A

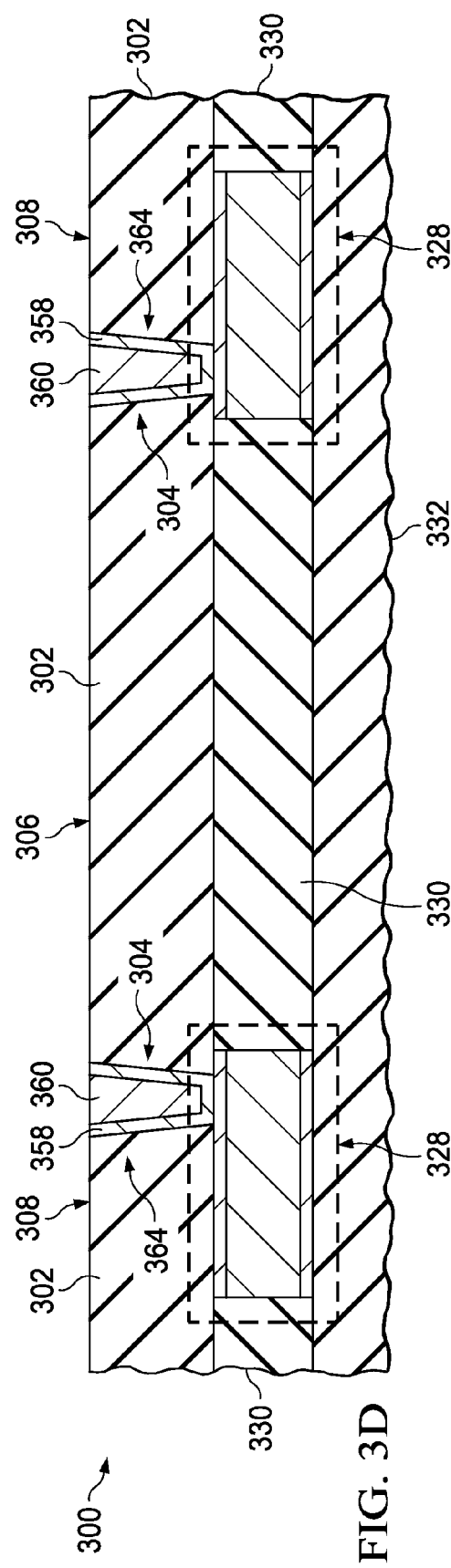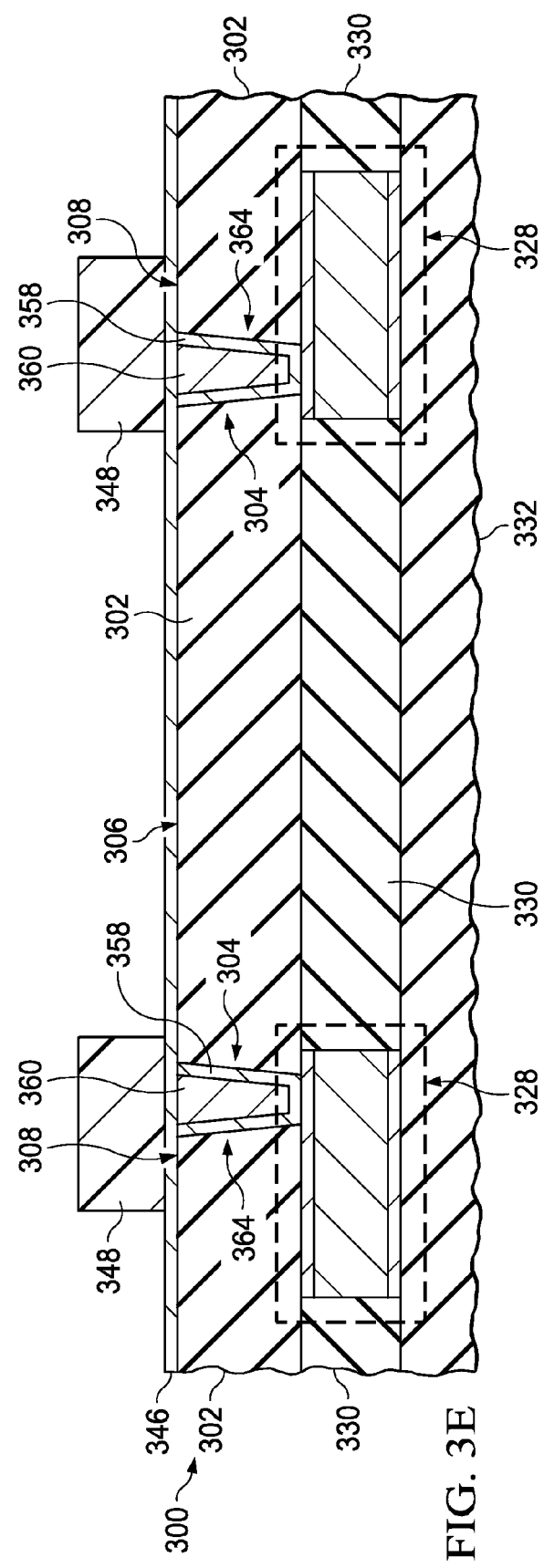

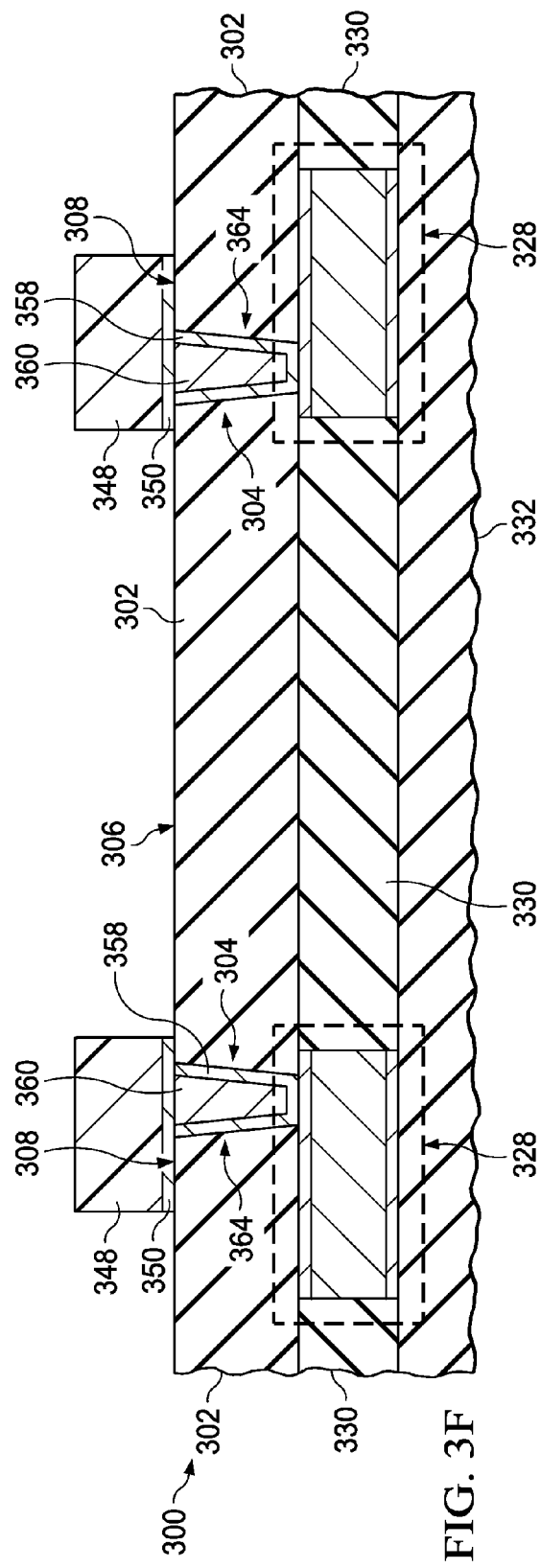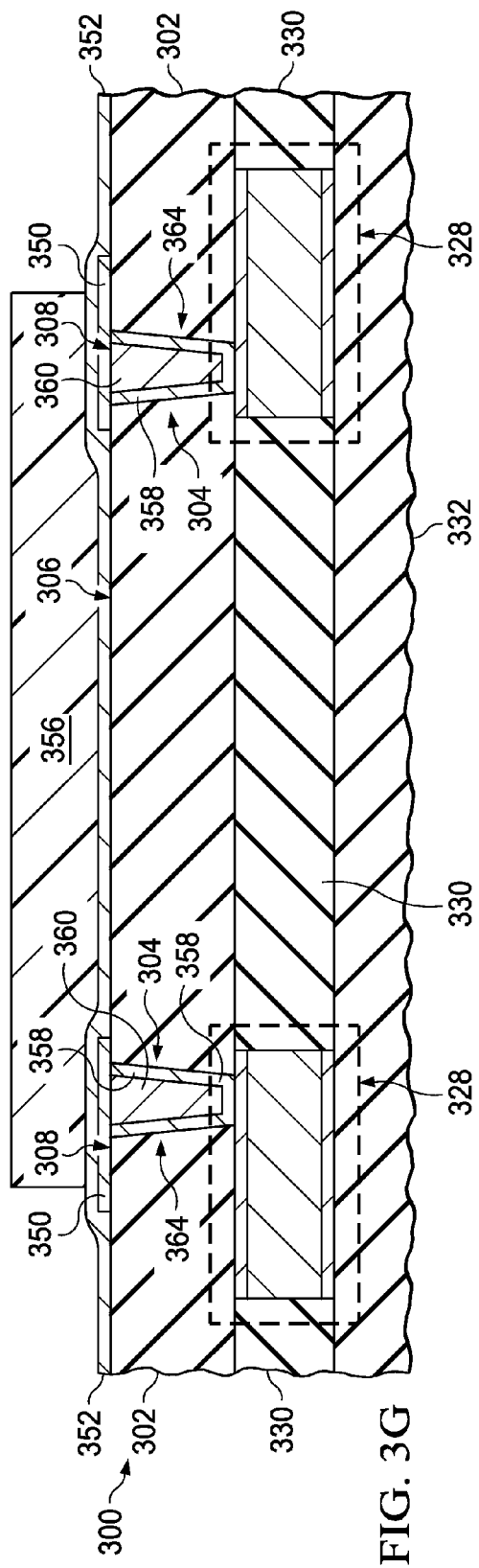

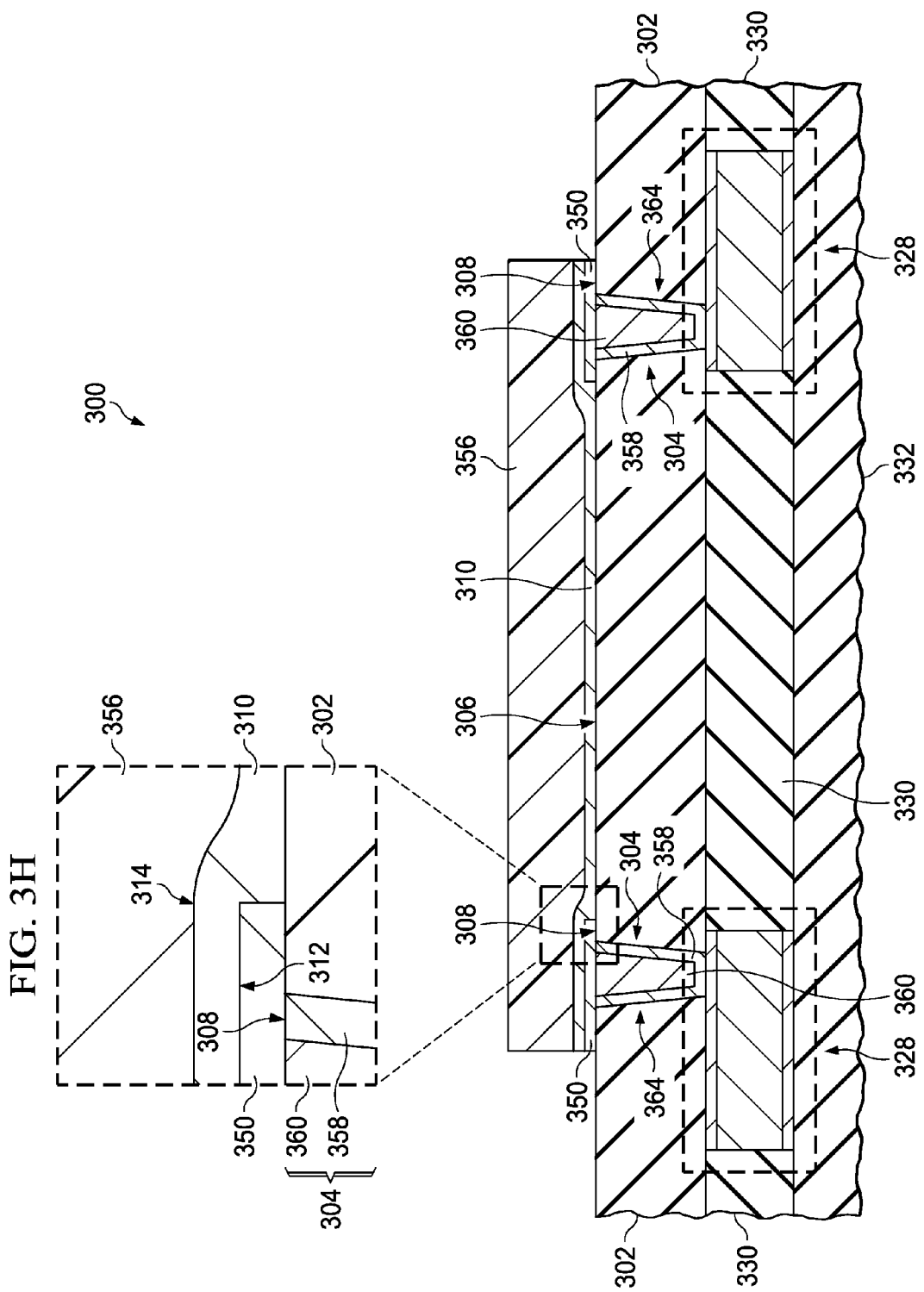

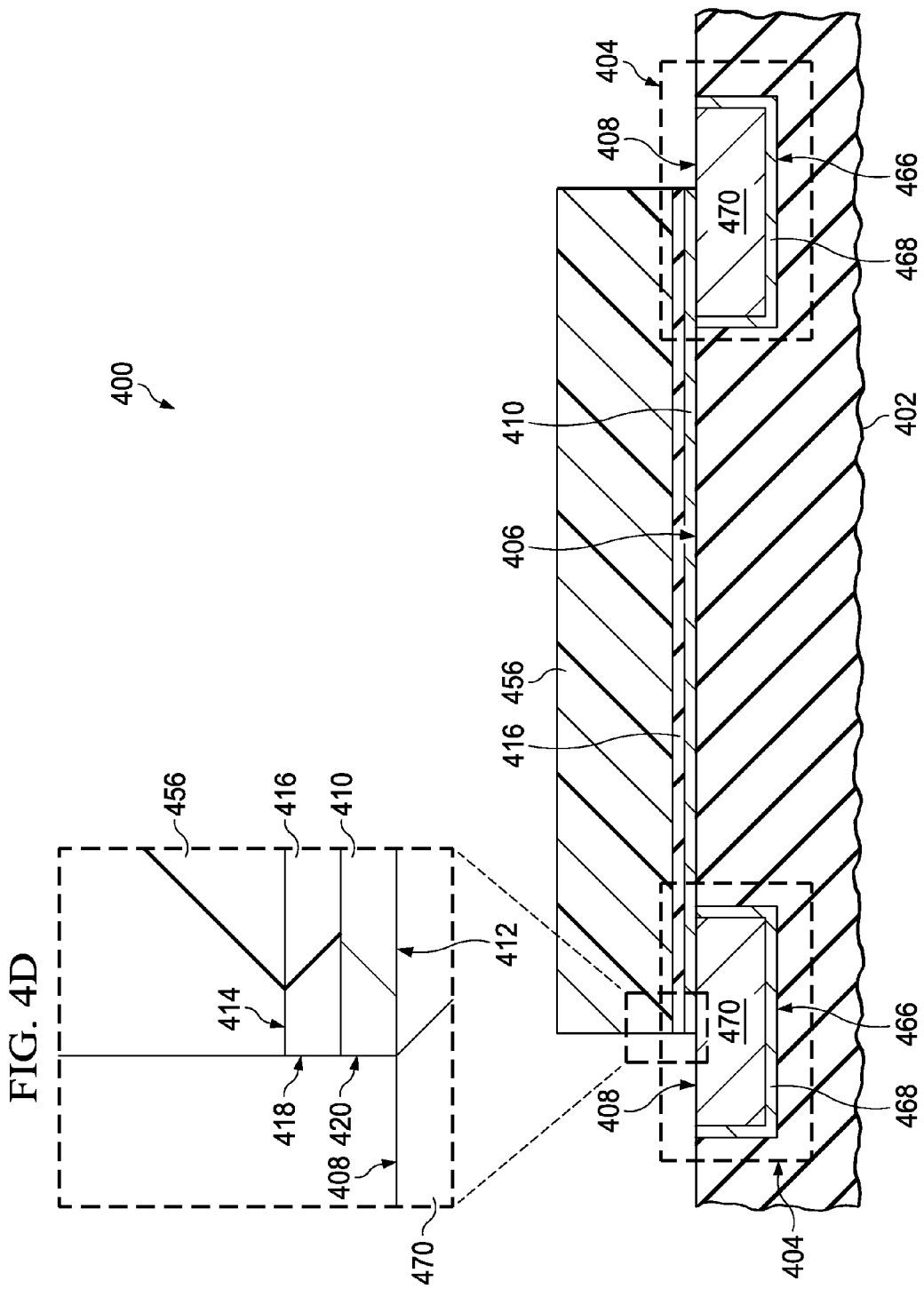

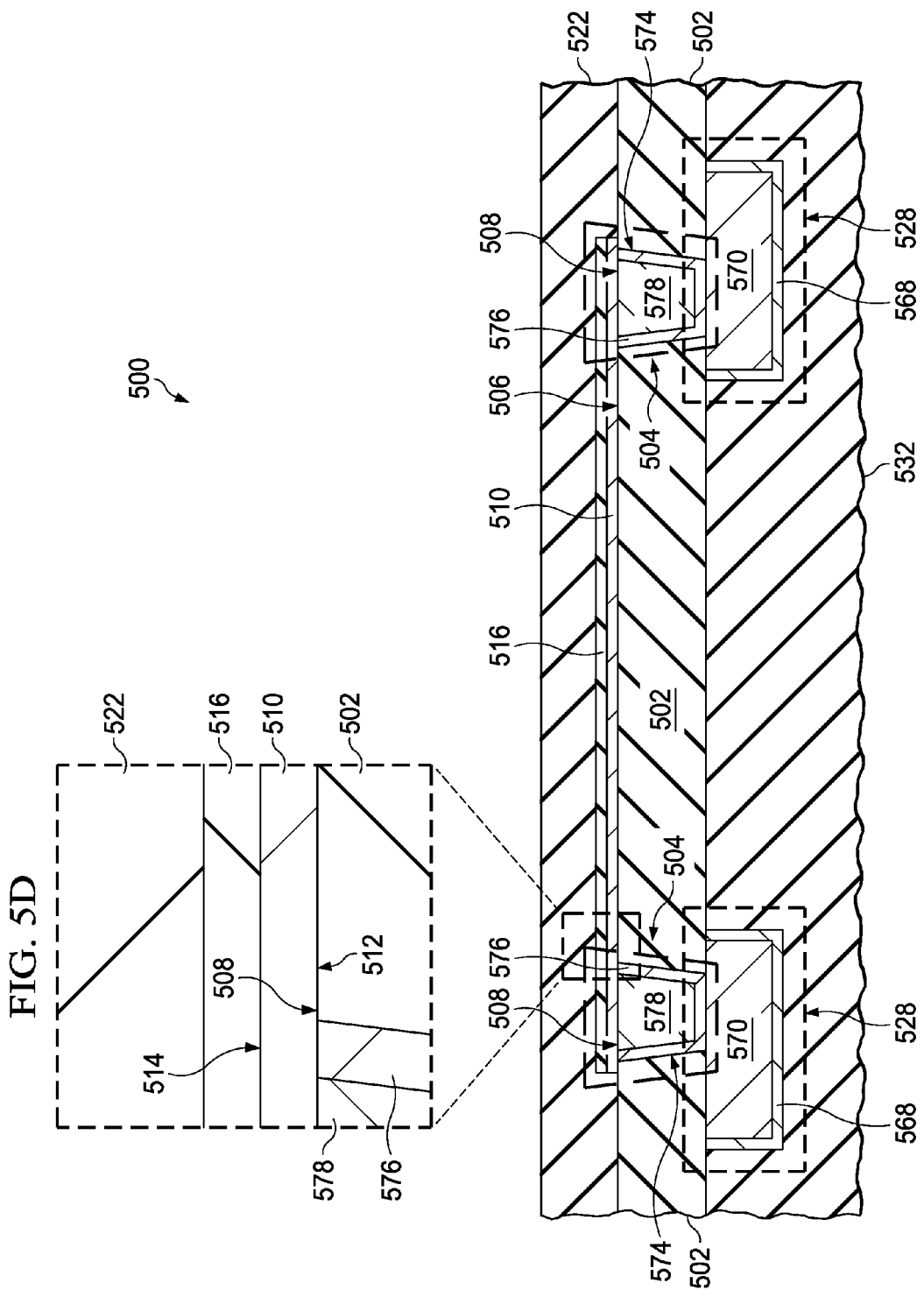

SINGLE PHOTOMASK HIGH PRECISION THIN FILM RESISTOR

CROSS-REFERENCE TO RELATED APPLICATIONS

This application claims the benefit of priority under U.S.C. §119(e) of U.S. Provisional Application 61/747,107 (Texas Instruments docket number TI-68570P, filed Dec. 28, 2012).

FIELD OF THE INVENTION

This invention relates to the field of integrated circuits. More particularly, this invention relates to high precision thin film resistors in integrated circuits.

BACKGROUND OF THE INVENTION

Thin film resistors are well known and may comprise a variety of resistive materials, with the resistive materials such as nickel chromium, silicon chromium and tantalum silicon nitride being common. These types of thin-film resistors are formed in the back end of line (BEOL) of an integrated circuit manufacturing flow. In contrast to resistors located in the silicon substrate which suffer from relatively large parasitic capacitance to the substrate, back end resistors have much less parasitic capacitance, since they are placed vertically above the substrate. Hence, BEOL resistors are preferred for high frequency RF applications.

Integrating a thin film resistor in the BEOL of an integrated circuit manufacturing flow adds cost and cycle time. A typical process flow for integrating a thin film resistor into an integrated circuit manufacturing may add two to three additional masking steps. To achieve high values of resistance, very thin films on the order of 1 to 10 nm may be required. One masking and etching step may be used to define the resistor. Since the resistor material is so thin, a special resistor contact pattern and etch may be required to form good electrical contact without damage to the thin resistor material, undesirably adding to fabrication cost and complexity. An alternative method may be to deposit a conductive landing pad material over the thin film resistor and then pattern and etch the material to provide landing pads for the contact etch. Etching the conductive landing pad material may damage the thin film resistor.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit contains a thin film resistor in which a body of the thin film resistor is disposed over a lower dielectric layer in a system of interconnects in the integrated circuit. Heads of the thin film resistor are disposed over electrodes which are interconnect elements in the lower dielectric layer, which provide electrical connections to a bottom surface of the thin film resistor. Top surfaces of the electrodes are substantially coplanar with a top surface of the lower dielectric layer. A top surface of the thin film resistor is free of electrical connections. An upper dielectric layer is disposed over the thin film resistor.

DESCRIPTION OF THE VIEWS OF THE DRAWING

FIG. 1 is a cross section of an exemplary integrated circuit containing a thin film resistor.

FIG. 2A through FIG. 2K are cross sections of an integrated circuit containing a thin film resistor formed by an exemplary process sequence, depicted in successive stages of fabrication.

FIG. 3A through FIG. 3I are cross sections of another integrated circuit containing a thin film resistor formed by an exemplary process sequence, depicted in successive stages of fabrication.

FIG. 4A through FIG. 4F are cross sections of another integrated circuit containing a thin film resistor formed by an exemplary process sequence, depicted in successive stages of fabrication.

FIG. 5A through FIG. 5D are cross sections of another integrated circuit containing a thin film resistor formed by an exemplary process sequence, depicted in successive stages of fabrication.

DETAILED DESCRIPTION

Figure 2A:
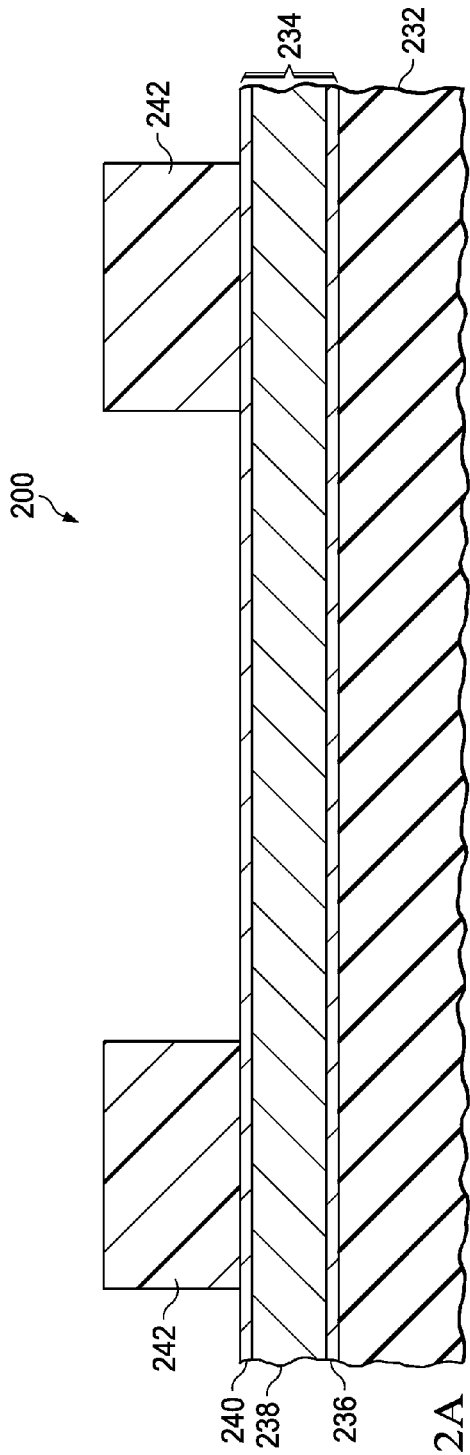

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit contains a thin film resistor in which a body of the thin film resistor is disposed over a lower dielectric layer in a system of interconnects in the integrated circuit. Heads of the thin film resistor are disposed over electrodes which are interconnect elements in the lower dielectric layer, which provide electrical connections to a bottom surface of the thin film resistor. Top surfaces of the electrodes are substantially coplanar with a top surface of the lower dielectric layer. An upper dielectric layer is disposed over the thin film resistor. A top surface of the thin film resistor is free of electrical connections.

An optional thin protective dielectric layer with a lateral boundary which is coincident with a lateral boundary of the thin film resistor may be disposed over the thin film resistor under the upper dielectric layer. Optional contact layers of metal may be disposed between the electrodes and the thin film resistor.

FIG. 1 is a cross section of an exemplary integrated circuit containing a thin film resistor. The integrated circuit 100 contains a lower dielectric layer 102 which is part of a system of interconnect elements and dielectric layers over components such as transistors. The lower dielectric layer 102 may be, for example, predominantly silicon dioxide-based dielectric material, or predominantly low-k dielectric material such as organo-silicate glass (OSG), carbon-doped silicon oxides (SiCO or CDO) or dielectric material formed from methylsilsesquioxane (MSQ). The lower dielectric layer 102 may possibly have an optional cap layer such as silicon nitride and/or silicon carbide at a top surface 106 of the lower dielectric layer 102.

Electrodes 104, which are interconnect elements such as interconnect lines or interconnect vias, are disposed in the lower dielectric layer 102. Top surfaces 108 of the electrodes 104 are substantially coplanar with a top surface 106 of the lower dielectric layer 102 between the electrodes 104. The electrodes 104 may be, for example, etch-defined aluminum lines, single or dual damascene copper lines, damascene tungsten vias, or single damascene copper vias.

The thin film resistor 110 is disposed over the lower dielectric layer 102 and overlaps the electrodes 104. The thin film resistor 110 may include, for example, one or more layers of nickel chromium, silicon chromium and/or tantalum silicon nitride. Other resistive materials for the thin film resistor 110 are within the scope of the instant example. The thin film resistor 110 may be, for example, 1.5 nanometers to 10 nanometers thick. In one version of the instant example, the thin film resistor 110 may be 3 nanometers to 4 nanometers thick. The electrodes 104 make electrical connections to a bottom surface 112 of the thin film resistor 110. A top surface 114 of the thin film resistor 110 is free of electrical connections.

An optional thin protective dielectric layer 116 may be disposed over the thin film resistor 110 so that a lateral boundary 118 of the protective dielectric layer 116 is substantially coincident with a lateral boundary 120 of the thin film resistor 110. The protective dielectric layer 116 may include, for example, one or more layers of silicon dioxide, silicon nitride and/or silicon oxynitride, 5 nanometers to 25 nanometers thick.

An upper dielectric layer 122 is disposed over the thin film resistor 110 and over the protective dielectric layer 116 if present. The upper dielectric layer 122 is also part of the system of interconnect elements and dielectric layers of the integrated circuit 100. The upper dielectric layer 122 may include similar material as the lower dielectric layer 102. The upper dielectric layer 122 may possibly have an optional etch stop layer of silicon nitride or silicon carbide at a bottom surface of the upper dielectric layer 122.

Electrical connections 124 to the electrodes 104 may be disposed in the upper dielectric layer 122 as depicted in FIG. 1, or in the lower dielectric layer 102, or both. The electrical connections 124 may include, for example, vias 126 through the upper dielectric layer 122 making electrical contact directly to the electrodes 104 and interconnect lines 128 in an intra-metal dielectric (IMD) layer 130 which make electrical contact to the vias 126. Other configurations of electrical connections 124 to the electrodes 104 are within the scope of the instant example. Forming the thin film resistor 110 to have its top surface 114 free of electrical connections may advantageously provide less damage to the thin film resistor 110 compared to other resistors with connections to top surfaces.

FIG. 2A through FIG. 2K are cross sections of an integrated circuit containing a thin film resistor formed by an exemplary process sequence, depicted in successive stages of fabrication. Referring to FIG. 2A, the integrated circuit 200 contains a base dielectric layer 232 which is part of a system of interconnect elements and dielectric layers over components such as transistors. The base dielectric layer 232 may be, for example, an inter-level dielectric (ILD) layer of predominantly silicon dioxide-based dielectric material, or predominantly low-k dielectric material, or may be a pre-metal dielectric (PMD) layer of boron phosphorus silicate glass (BPSG). Silicon dioxide-based dielectric material in the base dielectric layer 232 may be formed, for example, by a plasma enhanced chemical vapor deposition (PECVD) process using tetraethyl orthosilicate, also known as tetraethoxysilane or TEOS, or a PECVD process using dichlorosilane and oxygen. The base dielectric layer 232 may possibly have an optional cap layer such as silicon nitride and/or silicon carbide at a top surface of the base dielectric layer 232.

A layer of interconnect metal 234 is formed over the base dielectric layer 232. The layer of interconnect metal 234 may include, for example, a layer of adhesion metal 236 such as 5 nanometers to 20 nanometers of sputtered titanium, sputtered titanium tungsten and/or reactively sputtered titanium nitride directly over the base dielectric layer 232. The layer of interconnect metal 234 may then include a layer of sputtered aluminum-based metal 238, 50 nanometers to 1000 nanometers thick, on the layer of adhesion metal 236. The layer of sputtered aluminum-based metal 238 may include a few percent titanium, silicon or copper. The layer of interconnect metal 234 may then include an anti-reflection layer 240 of reactively sputtered titanium nitride, 10 nanometers to 20 nanometers thick.

An electrode mask 242 is formed over the layer of interconnect metal 234 so as to cover areas for subsequently formed electrodes. The electrode mask 242 may include photoresist, bottom anti-reflection coating (BARC) material, and/or possibly hard mask material such as silicon nitride. The electrode mask 242 may be part of an interconnect line mask which also covers areas for interconnect lines.

Figure 2B:
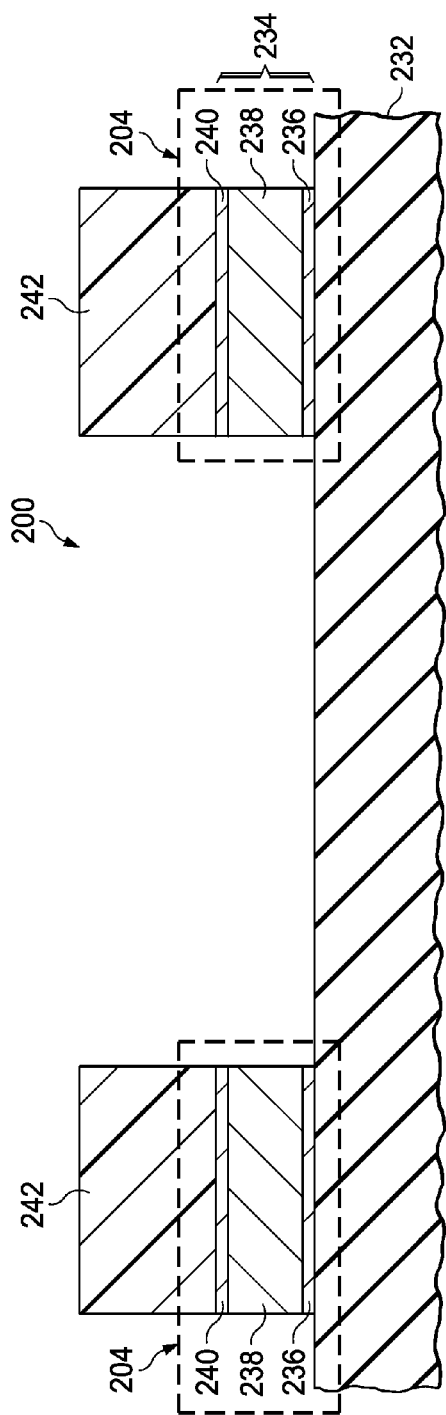

Referring to FIG. 2B, an interconnect line etch process removes the layer of interconnect metal 234 which is exposed by the electrode mask 242 to form electrodes 204. The interconnect line etch process may include a reactive ion etch (RIE) step using fluorine radicals to etch titanium nitride in the anti-reflection layer 240. The interconnect line etch process may then include an RIE step using chlorine radicals to etch aluminum in the layer of sputtered aluminum-based metal 238. The interconnect line etch process may then include an RIE step using fluorine radicals to etch the layer of adhesion metal 236. Interconnect lines may be formed concurrently with the electrodes 204. The electrode mask 242 is subsequently removed, for example by ashing.

Figure 2C:
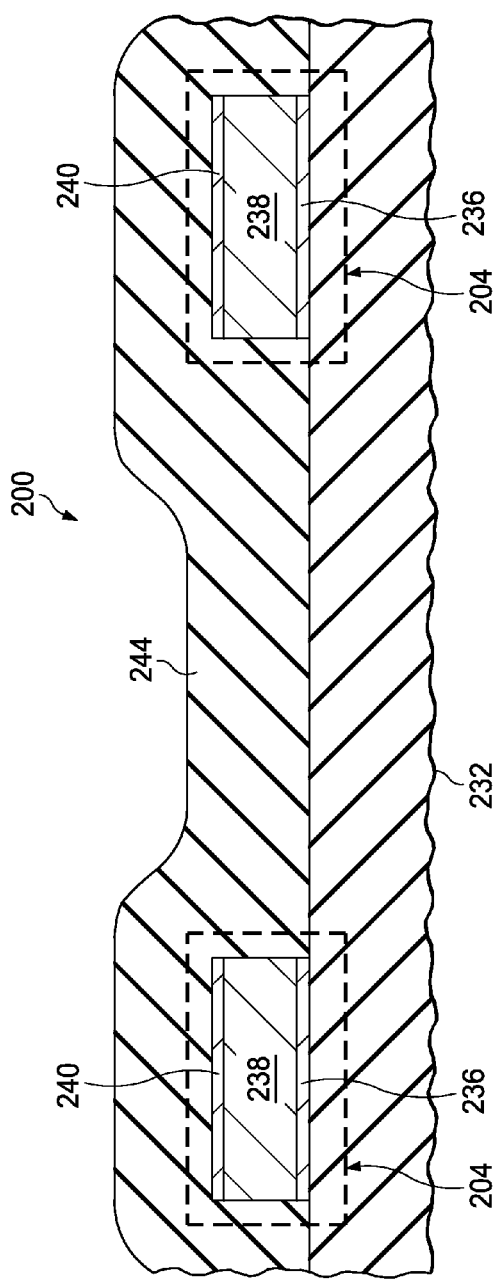

Referring to FIG. 2C, a layer of dielectric material 244 is formed over the electrodes 204 and the base dielectric layer 232. The layer of dielectric material 244 may be formed by spin coating the integrated circuit 200 with MSQ and baking the integrated circuit to form a semi-planarized layer of dielectric material 244. Alternatively, the layer of dielectric material 244 may be formed by a PECVD process using TEOS.

Figure 2D:
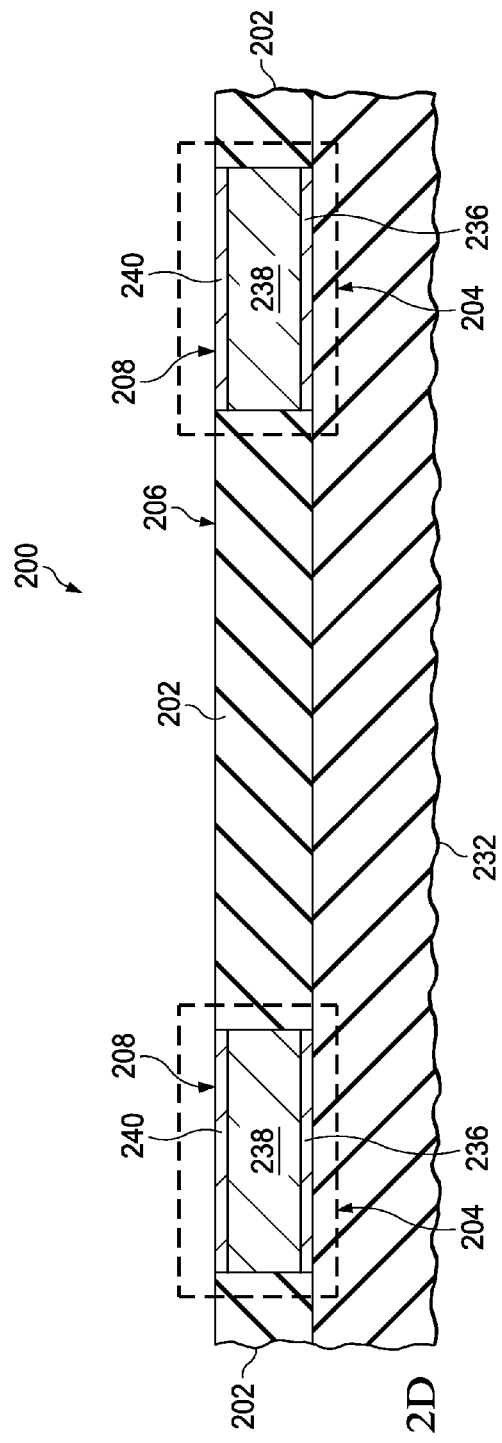

Referring to FIG. 2D, the layer of dielectric material 244 of FIG. 2C is planarized to form a lower dielectric layer 202 over the base dielectric layer 232 abutting and surrounding the electrodes 204. The planarization process is performed so that a top surface 206 of the lower dielectric layer 202 between the electrodes 204 is substantially coplanar with top surfaces 208 of the electrodes. The top surfaces 208 of the electrodes 204 are exposed by the planarization process. The planarization process may include, for example, a chemical mechanical polish (CMP) process and/or a resist etchback process.

Referring to FIG. 2E, an optional layer of contact metal 246 may be formed over the lower dielectric layer 202 and the electrodes 204 so as to make electrical contact to the top surfaces 208 of the electrodes 204. The layer of contact metal 246 may include, for example, one or more layers of sputtered titanium, sputtered titanium tungsten and/or reactively sputtered titanium nitride, 5 nanometers to 20 nanometers thick.

A contact mask 248 is formed over the layer of contact metal 246 and overlapping at least a portion of each electrode 204. In the instant example, the contact mask 248 is not continuous between the electrodes 204, so that subsequently formed contact metal will be localized to each electrode 204 and will not provide an electrical shunt between the electrodes 204. The contact mask 248 may include photoresist and/or hard mask material such as silicon dioxide or silicon nitride.

Referring to FIG. 2F, the layer of contact metal 246 of FIG. 2E which is exposed by the contact mask 248 is removed by an etch process leaving the layer of contact metal 246 under the contact mask 248 to form head contacts 250 on the top surface 208 of the electrodes 204. The etch process may include a wet etch step of an aqueous mixture of nitric acid and hydrogen peroxide, may include a plasma etch step, or may include an ion milling step. The contact mask 248 is removed after the etch process is completed. Photoresist in the contact mask 248 may be removed by ashing. Silicon dioxide and silicon nitride in the contact mask 248 may be removed by plasma etching.

Figure 2G:
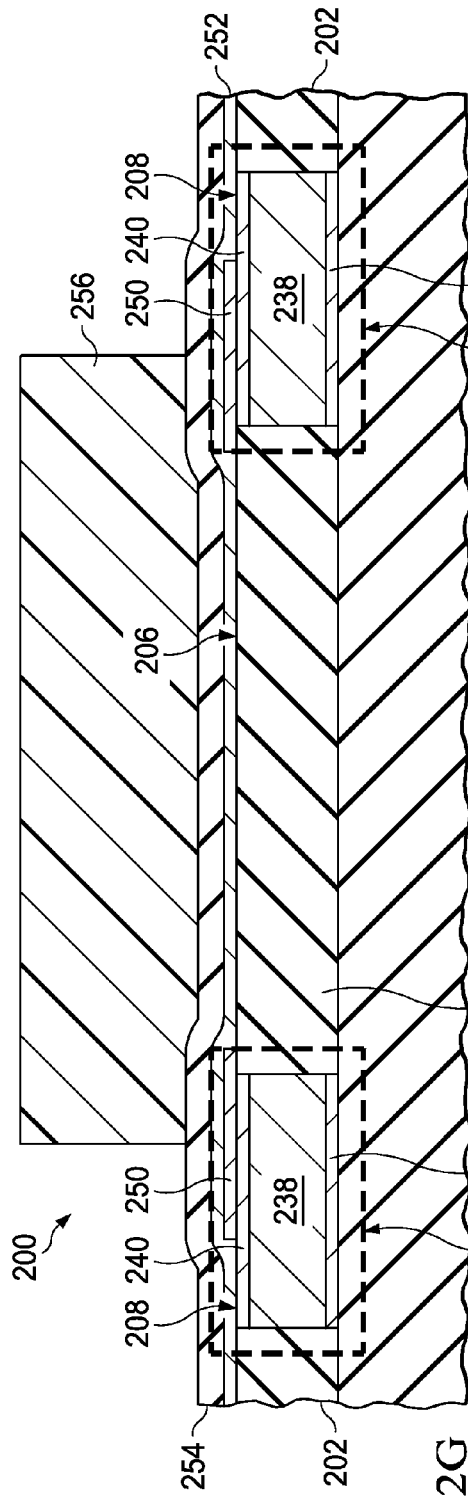

Referring to FIG. 2G, a layer of resistor material 252 is formed over an existing top surface of the integrated circuit 200, making electrical connection to the electrodes 204, through the head contacts 250 if present. The layer of resistor material 252 may include, for example, one or more layers of silicon chromium, nickel chromium and/or tantalum silicon nitride. Other resistive materials for the layer of resistor material 252 are within the scope of the instant example. The layer of resistor material 252 may be, for example, 1.5 nanometers to 10 nanometers thick. In one version of the instant example, the layer of resistor material 252 may be 3 nanometers to 4 nanometers thick.

An optional layer of protective dielectric material 254 may be formed over the layer of resistor material 252. The layer of protective dielectric material 254 may include, for example, one or more layers of silicon dioxide, silicon nitride and/or silicon oxynitride, 5 nanometers to 25 nanometers thick.

A resistor mask 256 is formed over the layer of resistor material 252, and over the layer of protective dielectric material 254 if present, overlapping the electrodes 204. The resistor mask 256 may include photoresist and/or hard mask material such as amorphous carbon.

Referring to FIG. 2H, the layer of protective dielectric material 254 and the layer of resistor material 252 of FIG. 2G are removed by an etch process in areas exposed by the resistor mask 256, leaving the layer of protective dielectric material 254 and the layer of resistor material 252 under the resistor mask 256 to form a protective dielectric layer 216 and a thin film resistor 210, respectively. A lateral boundary 218 of the protective dielectric layer 216 is substantially coincident with a lateral boundary 220 of the thin film resistor 210. The etch process may include a plasma etch step to remove the layer of protective dielectric material 254, and may include a wet etch step, may include a plasma etch step, or may include an ion milling step to remove the layer of resistor material 252. The thin film resistor makes electrical connections to the top surface 208 of the electrodes 204 at a bottom surface 212 of the thin film resistor 210, through the head contacts 250 if present. A top surface 214 of the thin film resistor 210 remains free of electrical connections.

The resistor mask 256 is removed after the etch process is completed. Photoresist in the resistor mask 256 may be removed by ashing. Amorphous carbon in the resistor mask 256 may also be removed by ashing.

Figure 2I:
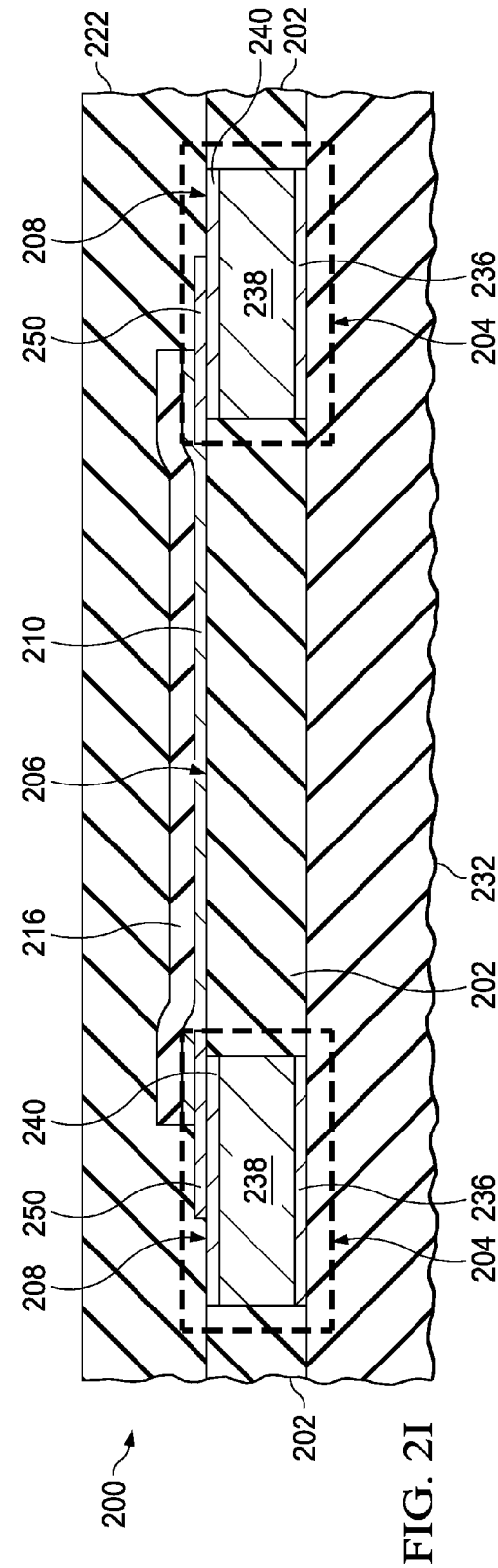

Referring to FIG. 2I, an upper dielectric layer 222 is formed over an existing top surface of the integrated circuit 200, covering the thin film resistor 210 and the protective dielectric layer 216 if present. The upper dielectric layer 222 is part of the system of interconnect elements and dielectric layers of the integrated circuit 200. The upper dielectric layer 222 may include silicon dioxide formed by a PECVD process using TEOS, or may include low-k dielectric materials formed by a PECVD process. The upper dielectric layer 222 may be, for example, 100 nanometers to 1000 nanometers thick. The upper dielectric layer 222 may possibly include a cap layer and/or an etch stop layer at its top surface.

Referring to FIG. 2J, vias 226 are formed through the upper dielectric layer 222 to make electrical connections to the top surfaces 208 of the electrodes 204 adjacent to the thin film resistor 210. The vias 226 may be formed, for example, by etching via holes through the upper dielectric layer 222 to expose the electrodes 204, forming a layer of liner metal 258 including sputtered titanium and reactively sputtered titanium nitride on the upper dielectric layer 222 and extending into the via hole, forming a layer of fill metal 260 including tungsten by a metal organic chemical vapor deposition (MOCVD) process on the layer of liner metal 258, and removing the fill metal 260 and liner metal 258 from the top surface of the upper dielectric layer 222 by a CMP process.

Figure 2K:
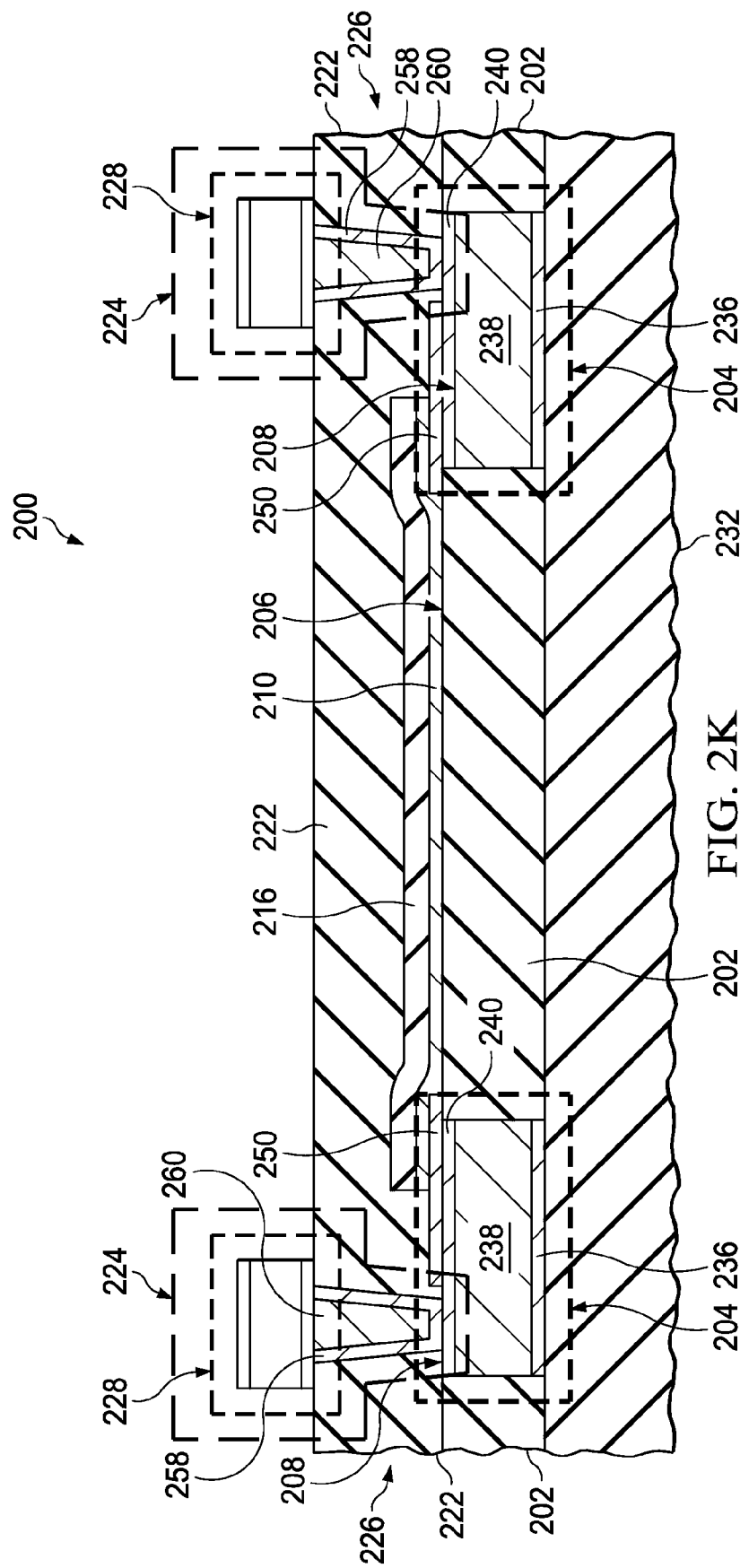

Referring to FIG. 2K, interconnect lines 228 are formed on the vias 226, for example by a similar process sequence as described in reference to FIG. 2A and FIG. 2B. The interconnect lines 228 and the vias 226 provide electrical connections 224 to the electrodes 204. Additional dielectric layers and interconnect elements may be formed over the interconnect lines 228. The process sequence described in reference to FIG. 2A through FIG. 2K may be advantageously be used for integrated circuits formed with etched aluminum interconnect lines and tungsten damascene vias, in which the thin film resistor 210 is desired to be formed on electrodes of interconnect lines.

Figure 3B:
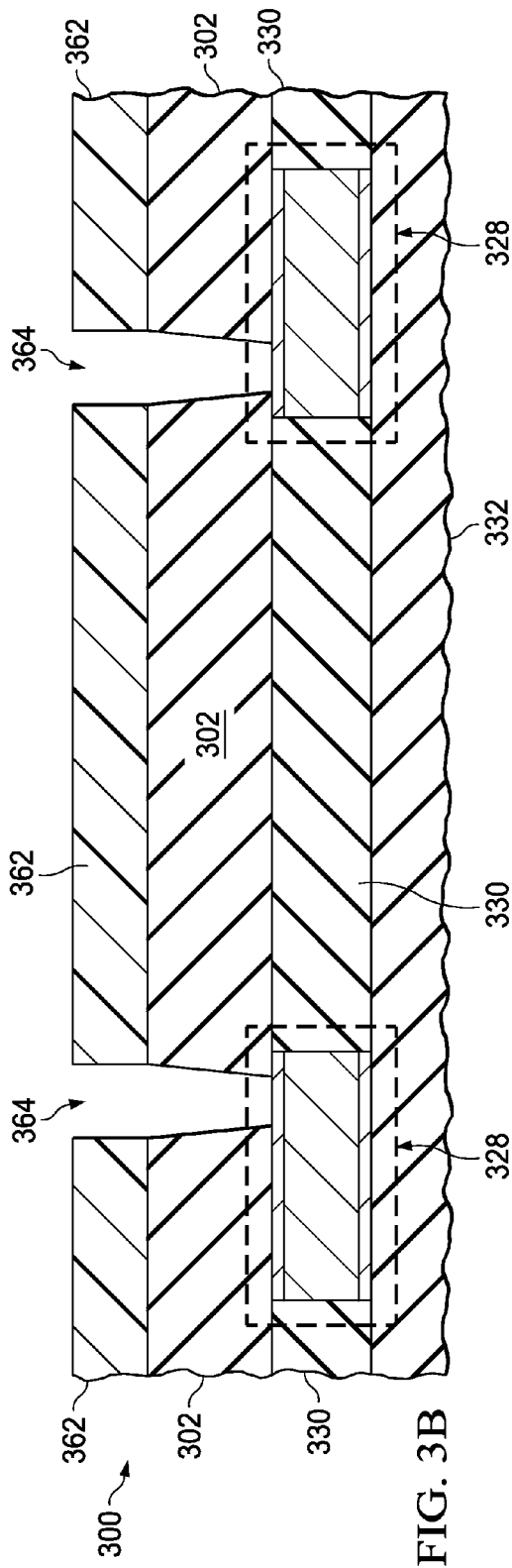

FIG. 3A through FIG. 3I are cross sections of another integrated circuit containing a thin film resistor formed by an exemplary process sequence, depicted in successive stages of fabrication. Referring to FIG. 3A, the integrated circuit 300 contains a base dielectric layer 332 which is part of a system of interconnect elements and dielectric layers over components such as transistors. The base dielectric layer 332 may be, for example, an ILD layer or a PMD layer. Interconnect lines 328 are formed over the base dielectric layer 332, for example as described in reference to FIG. 2A through FIG. 2D. An IMD layer 330 is formed over the base dielectric layer 332 surrounding the interconnect lines 328. The IMD layer 330 may be formed, for example, as described in reference to the layer of dielectric material 244 and the lower dielectric layer 202 of FIG. 2C and FIG. 2D. A lower dielectric layer 302, which is an ILD layer 302 in the instant example, is formed over the interconnect lines 328 and the IMD layer 330. The lower dielectric layer 302 may be formed, for example, as described in reference to the upper dielectric layer 222 of FIG. 2I. The lower dielectric layer 302 may include an etch stop layer at a bottom of the lower dielectric layer 302 and/or may include a cap layer at a top of the lower dielectric layer 302.

Referring to FIG. 3B, a via mask 362 is formed over the lower dielectric layer 302 which exposes areas for vias above the interconnect lines 328. The via mask 362 may include photoresist and an anti-reflection layer, or may include hard mask material such as amorphous carbon. Via holes 364 are formed through the lower dielectric layer 302 by an RIE process in the areas exposed by the via mask 362. The via mask 362 is removed. The via holes 364 may be completely etched through to the interconnect lines 328 before the via mask 362 is removed, or the via mask 362 may be removed when the via holes 364 are partially formed, for example down to the etch stop layer if present, and formation of the via holes 364 completed after the via mask 362 is removed.

Figure 3C:
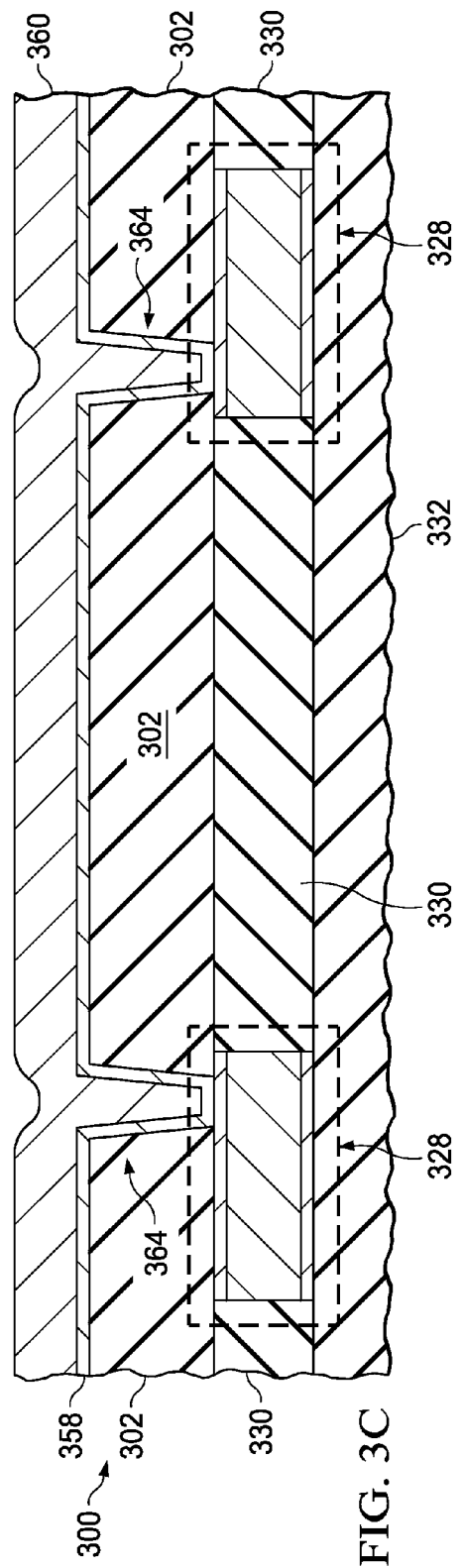

Referring to FIG. 3C, a metal liner 358 is formed over the lower dielectric layer 302 and in the via holes 364, making electrical contact to the interconnect lines 328. The metal liner 358 may include, for example, a layer of sputtered titanium on the lower dielectric layer 302 and the interconnect lines 328, and a layer of reactively sputtered titanium nitride on the layer of sputtered titanium. A layer of fill metal 360 is formed over the metal liner 358 so as to fill the via holes 364. The layer of fill metal 360 may include, for example, tungsten formed by an MOCVD process.

Referring to FIG. 3D, the fill metal 360 and the metal liner 358 are removed from over the lower dielectric layer 302, leaving electrodes 304, which are vias 304 in the instant example, through the lower dielectric layer 302 making electrical connections with the interconnect lines 328. Top surfaces 308 of the electrodes 304 are substantially coplanar with a top surface 306 of the lower dielectric layer 302 between the electrodes 304. The fill metal 360 and the metal liner 358 may be removed from over the lower dielectric layer 302 by CMP and/or etchback processes.

Referring to FIG. 3E, an optional layer of contact metal 346 may be formed over the lower dielectric layer 302 and the electrodes 304 so as to make electrical contact to the top surfaces 308 of the electrodes 304. The layer of contact metal 346 may be formed as described in reference to FIG. 2E. A contact mask 348 is formed over the layer of contact metal 346 and overlapping at least a portion of each electrode 304. In the instant example, the contact mask 348 is not continuous between the electrodes 304, so that subsequently formed contact metal will be localized to each electrode 304 and will not provide an electrical shunt between the electrodes 304. The contact mask 348 may be formed as described in reference to FIG. 2E.

Referring to FIG. 3F, the layer of contact metal 346 of FIG. 3E which is exposed by the contact mask 348 is removed by an etch process leaving the layer of contact metal 346 under the contact mask 348 to form head contacts 350 on the top surface 308 of the electrodes 304. The etch process may be performed as described in reference to FIG. 2F. The contact mask 348 is removed after the etch process is completed, for example as described in reference to FIG. 2F.

Referring to FIG. 3G, a layer of resistor material 352 is formed over an existing top surface of the integrated circuit 300, making electrical connection to the electrodes 304, through the head contacts 350 if present. The layer of resistor material 352 may be formed as described in reference to FIG. 2G. Other resistive materials for the layer of resistor material 352 are within the scope of the instant example. An optional layer of protective dielectric material may possibly be formed over the layer of resistor material 352 as described in reference to FIG. 2G. A resistor mask 356 is formed over the layer of resistor material 352, and over the layer of protective dielectric material 354 if present, overlapping the electrodes 304. The resistor mask 356 may include photoresist and/or hard mask material such as amorphous carbon.

Referring to FIG. 3H, the layer of resistor material 352 of FIG. 3G and any exposed portions of the head contacts 350 are removed by an etch process in areas exposed by the resistor mask 356, leaving the layer of resistor material 352 under the resistor mask 356 to form a thin film resistor 310, respectively. The etch process may be performed as described in reference to FIG. 2H. The thin film resistor makes electrical connections to the top surface 308 of each electrode 304 at a bottom surface 312 of the thin film resistor 310, through the head contacts 350 if present. A top surface 314 of the thin film resistor 310 remains free of electrical connections. The resistor mask 356 is removed after the etch process is completed, for example as described in reference to FIG. 2H.

Figure 3I:
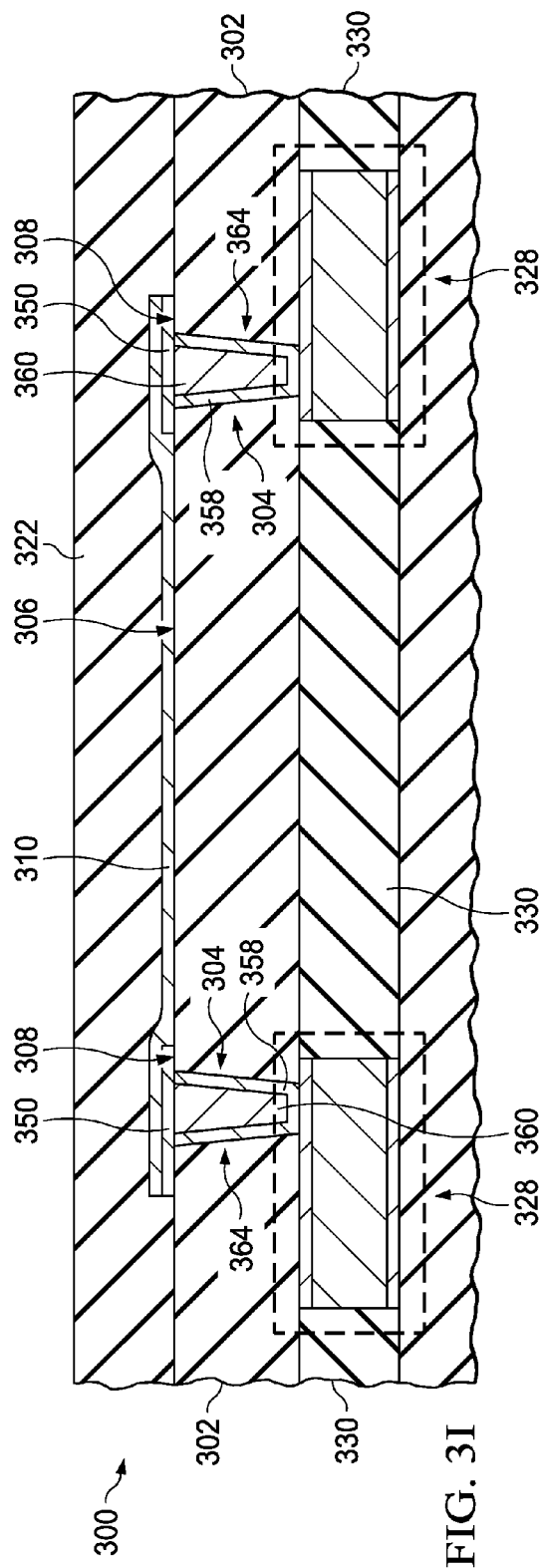

Referring to FIG. 3I, an upper dielectric layer 322 is formed over an existing top surface of the integrated circuit 300, covering the thin film resistor 310. The upper dielectric layer 322 is part of the system of interconnect elements and dielectric layers of the integrated circuit 300. The upper dielectric layer 322 may be formed as described in reference to FIG. 2I.

Figure 4A:
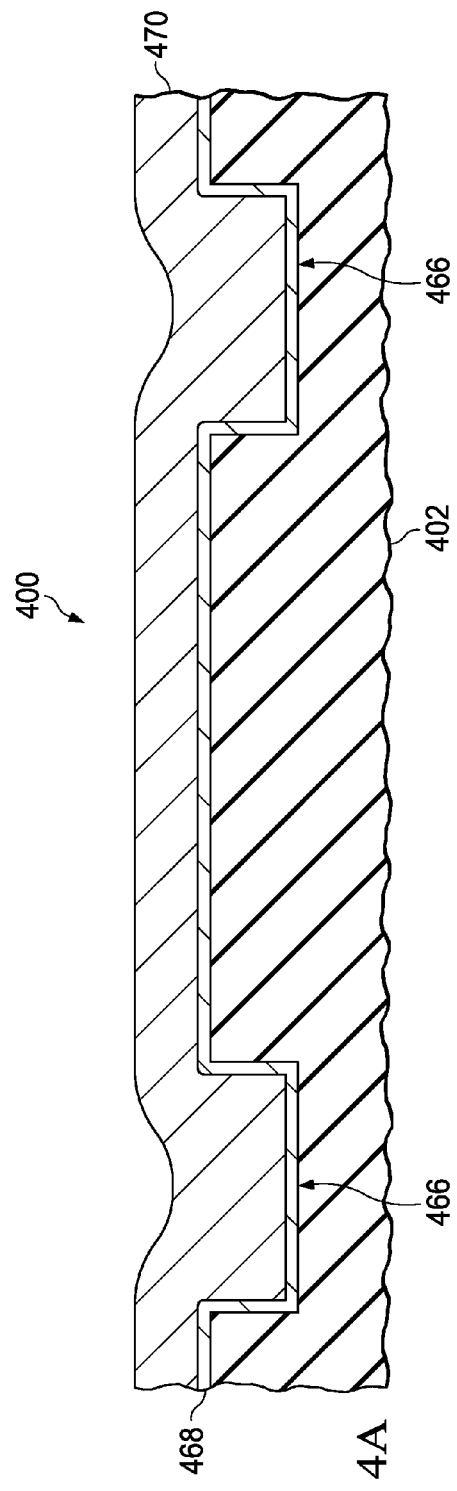

FIG. 4A through FIG. 4F are cross sections of another integrated circuit containing a thin film resistor formed by an exemplary process sequence, depicted in successive stages of fabrication. Referring to FIG. 4A, the integrated circuit 400 contains a lower dielectric layer 402 which is part of a system of interconnect elements and dielectric layers over components such as transistors. The lower dielectric layer 402 may include a cap layer of silicon nitride, silicon oxynitride, silicon carbide and/or silicon carbide nitride.

First interconnect trenches 466, for subsequently formed electrodes, are formed in the lower dielectric layer 402, which is a first ILD layer 402 in the instant example. A first metal liner 468 is formed over the lower dielectric layer 402 extending into the first interconnect trenches 466. The first metal liner 468 may include, for example, 2 nanometers to 10 nanometers of tantalum nitride formed by an atomic layer deposition (ALD) process. The first metal liner 468 may also include a layer of sputtered copper seed metal formed on the tantalum nitride. A layer of first fill metal 470 is formed on the first metal liner 468, filling the first interconnect trenches 466. The layer of first fill metal 470 may include electroplated copper.

Figure 4B:
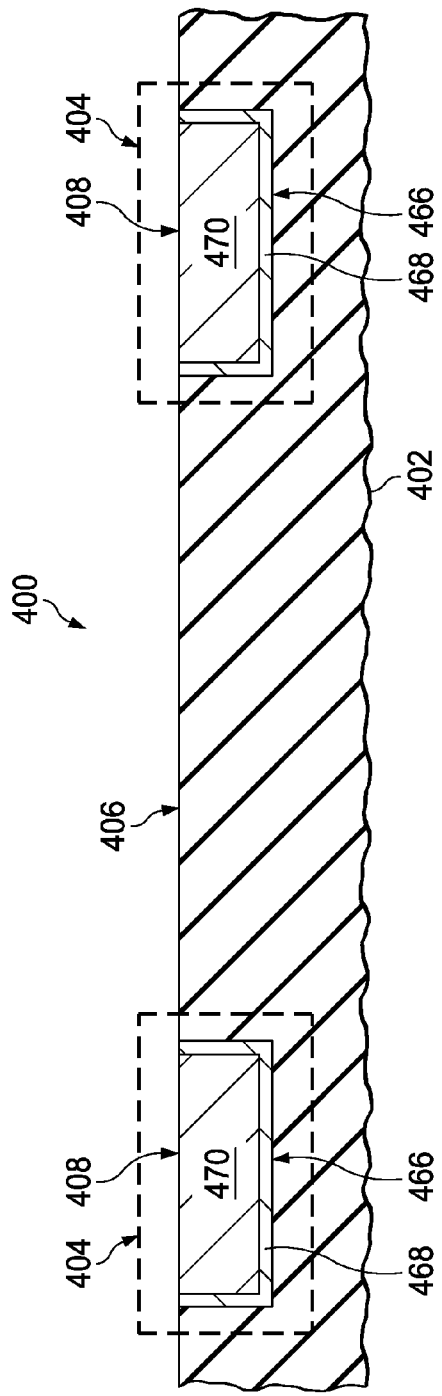

Referring to FIG. 4B, the first fill metal 470 and the first metal liner 468 are removed from over the lower dielectric layer 402, leaving electrodes 404, which are damascene interconnect lines 404 in the instant example, in the lower dielectric layer 402. Top surfaces 408 of the electrodes 404 are substantially coplanar with a top surface 406 of the lower dielectric layer 402 between the electrodes 404. The first fill metal 470 and the first metal liner 468 may be removed from over the lower dielectric layer 402 by a CMP process.

Figure 4C:
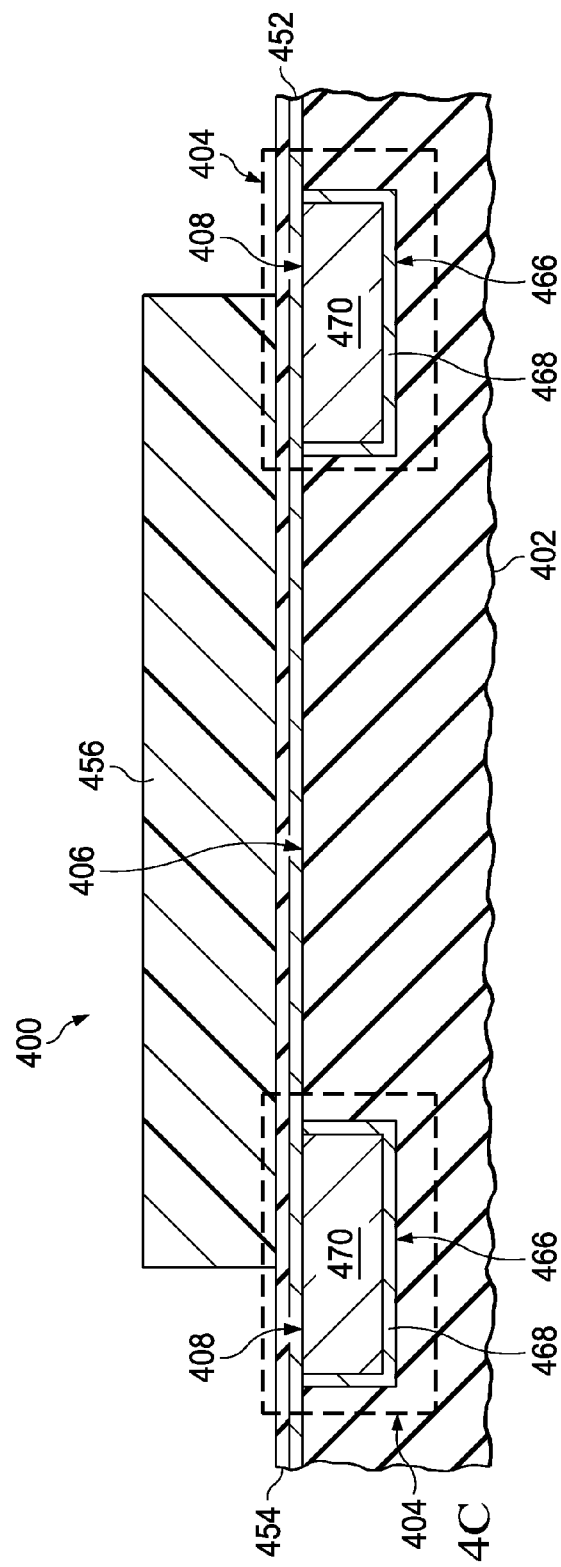

Referring to FIG. 4C, a layer of resistor material 452 is formed over an existing top surface of the integrated circuit 400, making electrical connection to the electrodes 404. The layer of resistor material 452 may be formed as described in reference to FIG. 2G. Other resistive materials for the layer of resistor material 452 are within the scope of the instant example.

An optional layer of protective dielectric material 454 may be formed over the layer of resistor material 452. The layer of protective dielectric material 454 may include, for example, one or more layers of silicon dioxide, silicon nitride and/or silicon oxynitride, 5 nanometers to 25 nanometers thick.

A resistor mask 456 is formed over the layer of resistor material 452, and over the layer of protective dielectric material 454 if present, overlapping the electrodes 404. The resistor mask 456 may include photoresist and/or hard mask material such as amorphous carbon.

Referring to FIG. 4D, the layer of protective dielectric material 454 and the layer of resistor material 452 of FIG. 4C are removed by an etch process in areas exposed by the resistor mask 456, leaving the layer of protective dielectric material 454 and the layer of resistor material 452 under the resistor mask 456 to form a protective dielectric layer 416 and a thin film resistor 410, respectively. A lateral boundary 418 of the protective dielectric layer 416 is substantially coincident with a lateral boundary 420 of the thin film resistor 410.

The etch process may include a plasma etch step to remove the layer of protective dielectric material 454, and may include a wet etch step, may include a plasma etch step, or may include an ion milling step to remove the layer of resistor material 452. The thin film resistor 410 makes electrical connections to the top surface 408 of the electrodes 404 at a bottom surface 412 of the thin film resistor 410. A top surface 414 of the thin film resistor 410 remains free of electrical connections.

The resistor mask 456 is removed after the etch process is completed. Photoresist in the resistor mask 456 may be removed by ashing. Amorphous carbon in the resistor mask 456 may also be removed by ashing.

Figure 4E:
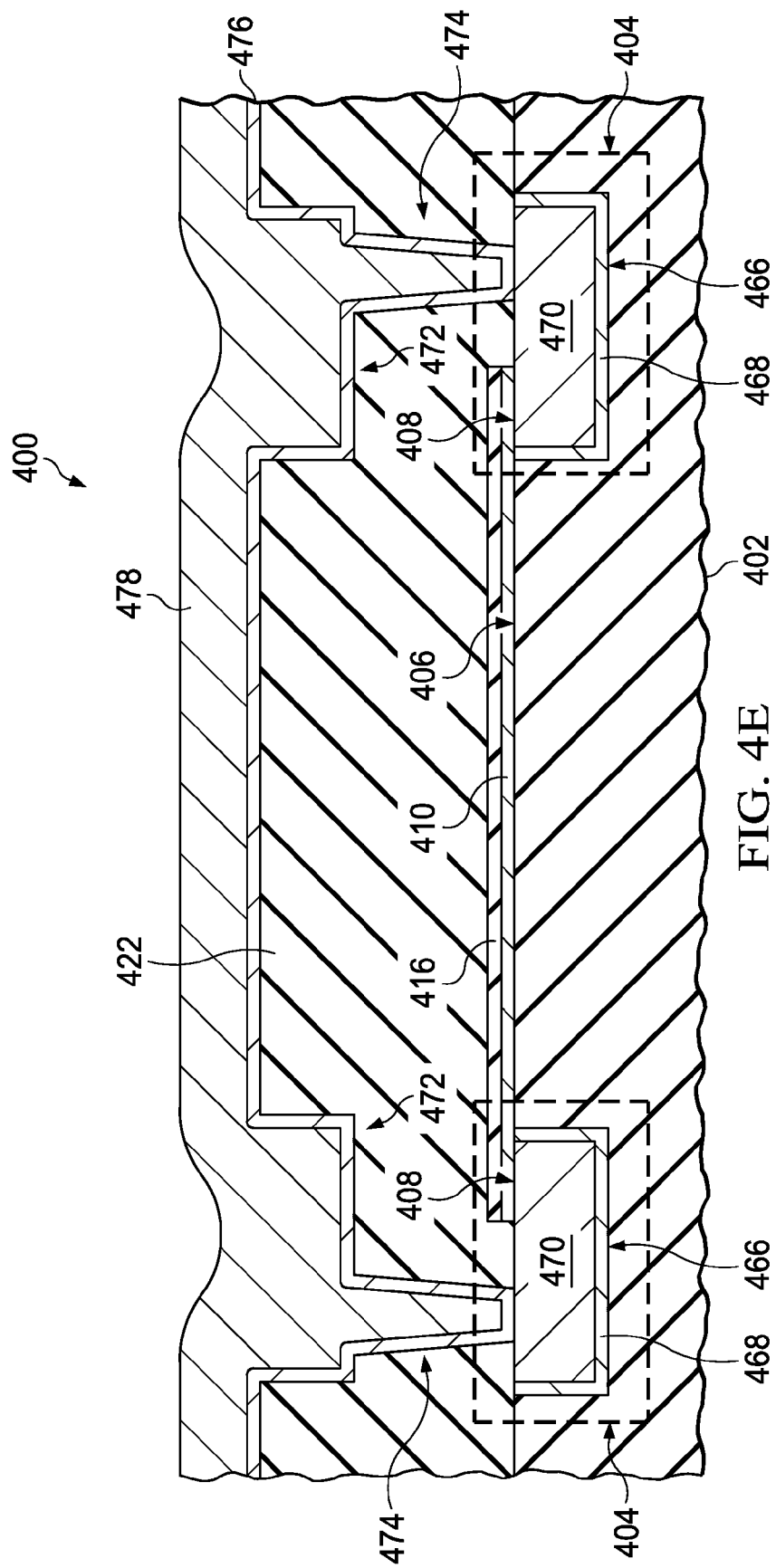

Referring to FIG. 4E, an upper dielectric layer 422 which in the instant example is a second ILD layer 422 is formed over the lower dielectric layer 402 and the thin film resistor 410 and over the protective dielectric layer 416 if present. The upper dielectric layer 422 may include similar materials and be formed by similar processes as the lower dielectric layer 402. The upper dielectric layer 422 may include an optional etch stop layer of silicon nitride, silicon oxynitride, silicon carbide and/or silicon carbide nitride at a bottom of the upper dielectric layer 422. The upper dielectric layer 422 may include an optional cap layer such as silicon nitride and/or silicon carbide at a top surface of the upper dielectric layer 422.

Second interconnect trenches 472 and via holes 474 are formed in the upper dielectric layer 422 so as to expose the top surfaces 408 of the electrodes 404. A second metal liner 476 is formed over the upper dielectric layer 422 extending into the second interconnect trenches 472 and via holes 474. The second metal liner 476 may include similar materials and be formed by similar processes as the first metal liner 468. A layer of second fill metal 478 is formed on the second metal liner 476, filling the second interconnect trenches 472 and via holes 474. The layer of second fill metal 478 may include electroplated copper similarly to the layer of first fill metal 470.

Figure 4F:
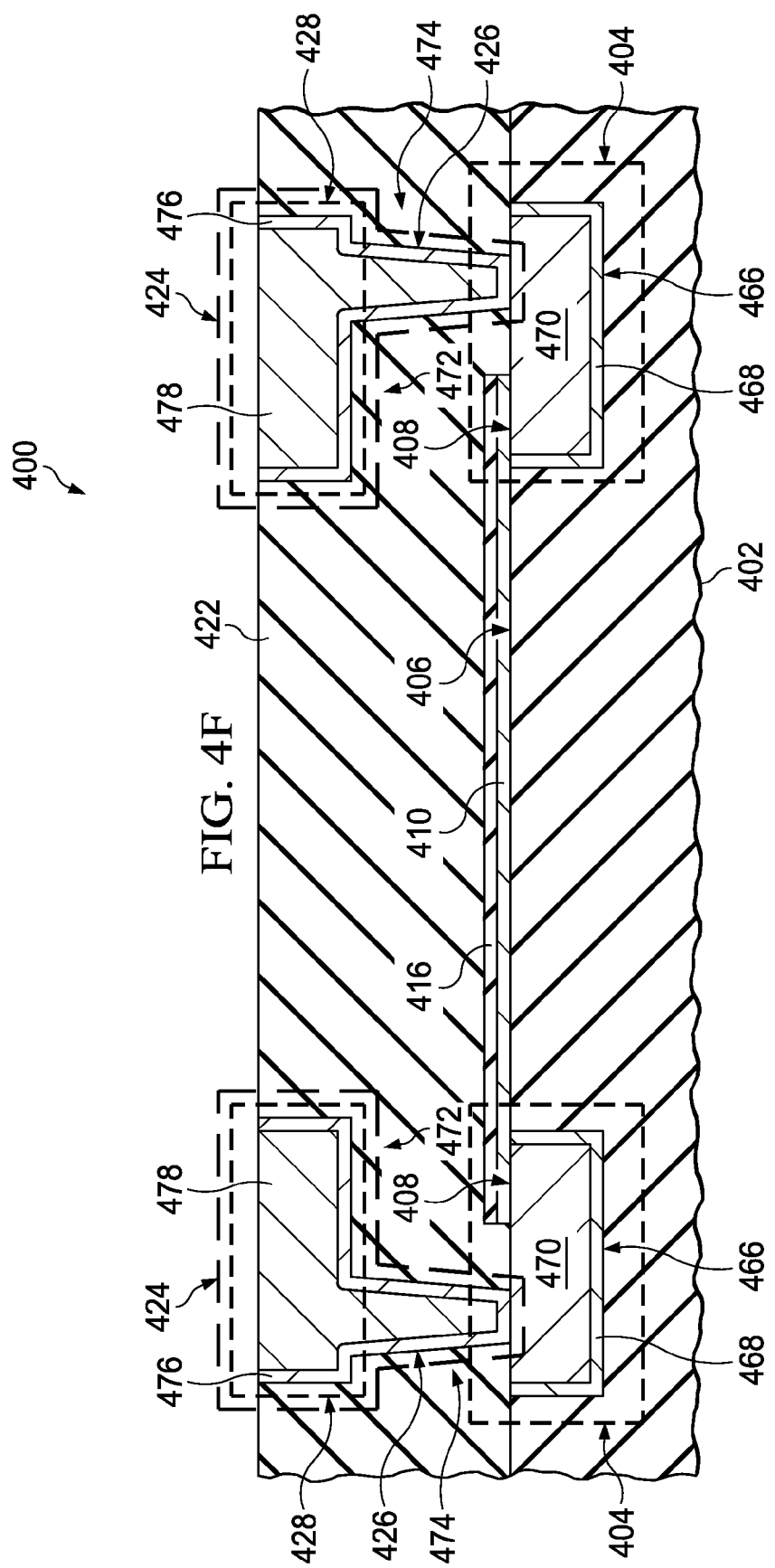

Referring to FIG. 4F, the second fill metal 478 and the second metal liner 476 are removed from over the upper dielectric layer 422, leaving electrical connections 424, which are dual damascene interconnect lines 480 and vias 482 in the instant example, in the upper dielectric layer 422. The second fill metal 478 and the second metal liner 476 may be removed from over the upper dielectric layer 422 by a CMP process. The electrical connections 424 make electrical contact to the electrodes 404 at the top surfaces 408. It will be recognized that the interconnect lines 480 and vias 482 may be formed using a single damascene process flow.

Additional dielectric layers and interconnect elements may be formed over the upper dielectric layer 422. The process sequence described in reference to FIG. 4A through FIG. 4F may be advantageously be used for integrated circuits formed with dual damascene interconnect lines and vias, in which the thin film resistor 410 is desired to be formed on electrodes of interconnect lines.

Figure 5A:
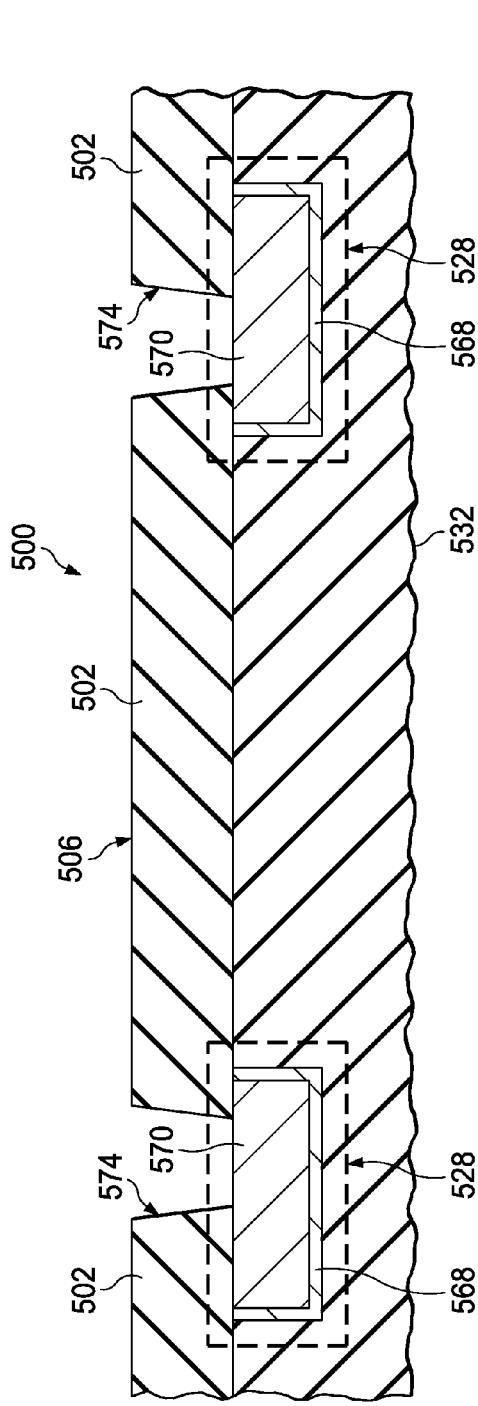

FIG. 5A through FIG. 5D are cross sections of another integrated circuit containing a thin film resistor formed by an exemplary process sequence, depicted in successive stages of fabrication. Referring to FIG. 5A, the integrated circuit 500 contains a base dielectric layer 532 which is part of a system of interconnect elements and dielectric layers over components such as transistors. The base dielectric layer 532 may be, for example, an ILD layer or an IMD layer. Electrical connections 528 which in the instant example are damascene interconnect lines 528 including a first metal liner 568 and a first fill metal 570 are formed in the base dielectric layer 532. The electrical connections 528 may be formed, for example, as described in reference to FIG. 4A and FIG. 4B.

A lower dielectric layer 502 which in the instant example is an ILD layer 502 is formed over the base dielectric layer 532 and the electrical connections 528. The lower dielectric layer 502 may include an etch stop layer at a bottom of the lower dielectric layer 502 and/or a cap layer at a top surface 506 of the lower dielectric layer 502. The lower dielectric layer 502 may include similar materials and be formed by similar processes as the base dielectric layer 532.

Via holes 574 are formed through the lower dielectric layer 502 so as to expose the electrical connections 528. The via holes 574 may be formed, for example, as described in reference to the via holes 364 of FIG. 3B.

Figure 5B:
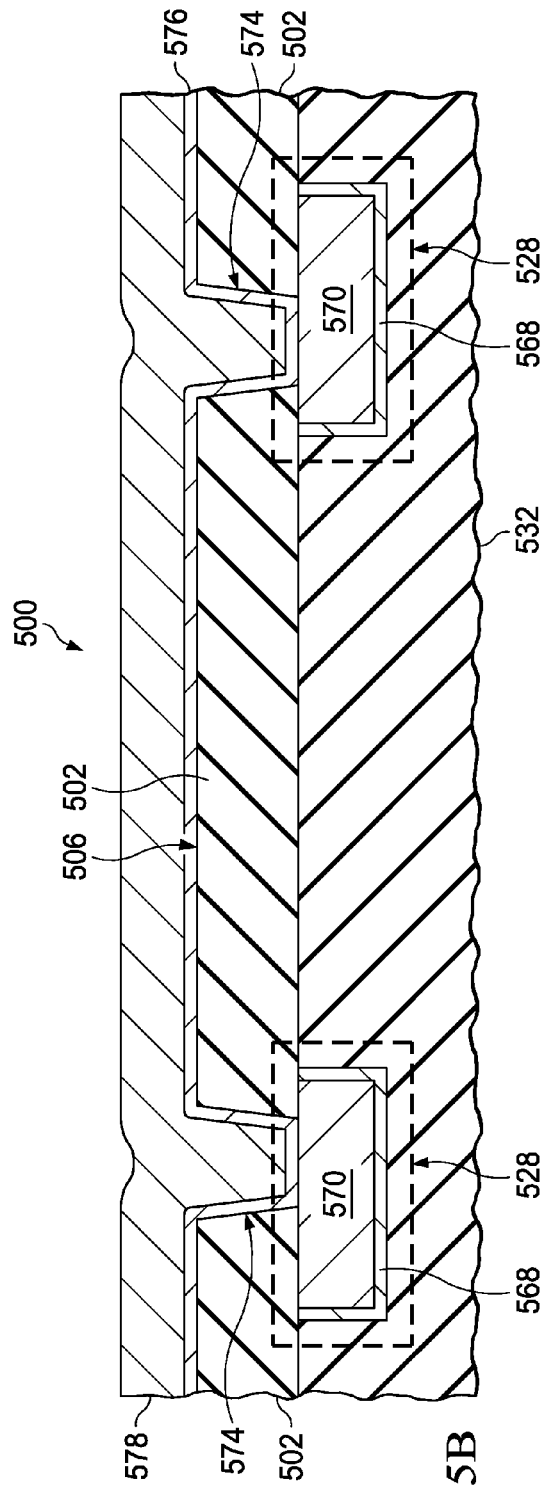

Referring to FIG. 5B, a second metal liner 576 is formed over the lower dielectric layer 502 extending into the via holes 574. The second metal liner 576 may include similar materials and be formed by similar processes as the second metal liner 476 of FIG. 4E. A layer of second fill metal 578 is formed on the second metal liner 476, filling the via holes 574. The layer of second fill metal 578 may include electroplated copper similarly to the layer of second fill metal 478 of FIG. 4E.

Figure 5C:
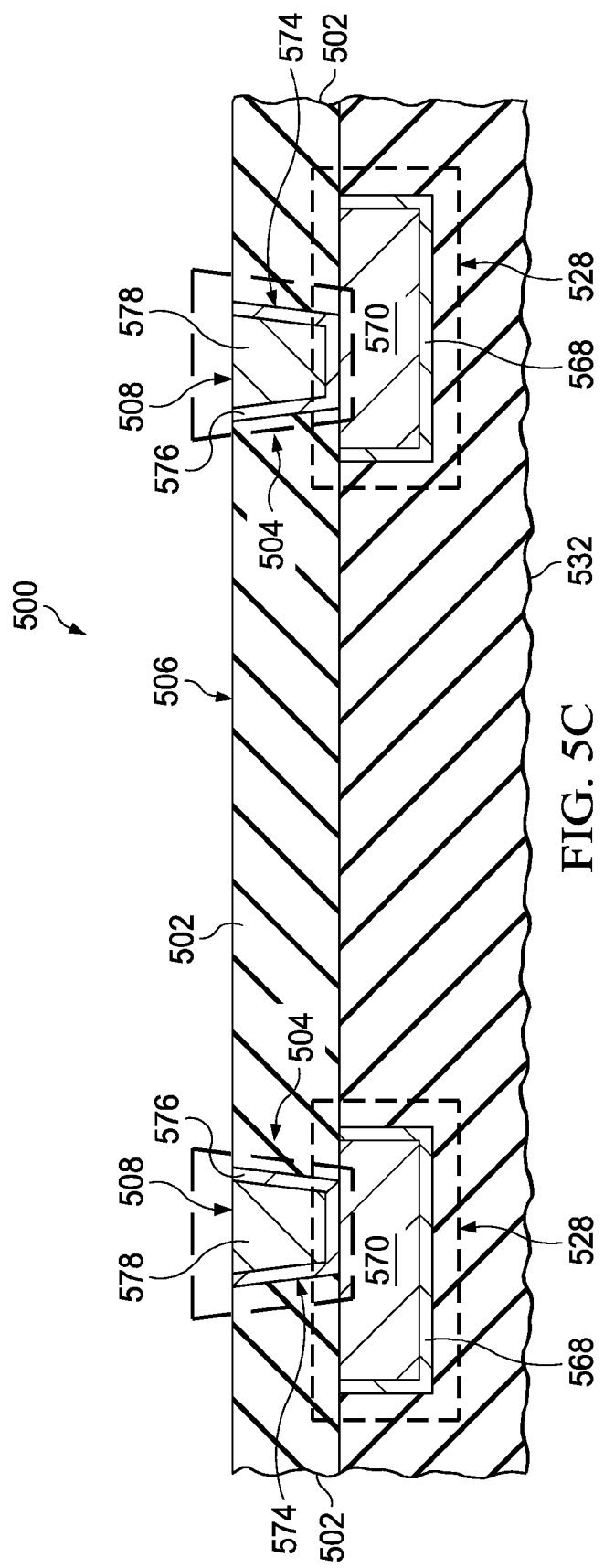

Referring to FIG. 5C, the second fill metal 578 and the second metal liner 576 are removed from over the lower dielectric layer 502, leaving electrodes 504, which are single damascene vias 504 in the instant example, in the lower dielectric layer 502. The second fill metal 578 and the second metal liner 576 may be removed from over the lower dielectric layer 502 by a CMP process. The electrodes 504 make electrical contact to the electrical connections 528. Top surfaces 508 of the electrodes 504 are substantially coplanar with the top surface 506 of the lower dielectric layer 502 between the electrodes 504.

Referring to FIG. 5D, a thin film resistor 510 is formed over the lower dielectric layer 502 so as to make electrical contact to the top surfaces 508 of the electrodes 504. The thin film resistor 510 makes electrical connections to the electrodes 504 at a bottom surface 512 of the thin film resistor 510. A top surface 514 of the thin film resistor 510 remains free of electrical connections. The thin film resistor 510 may be formed as described in reference to FIG. 4C and FIG. 4D. protective dielectric layer 516 may be formed over the thin film resistor 510, as described in reference to FIG. 4C and FIG. 4D.

An upper dielectric layer 522 which in the instant example is an IMD ILD layer 522 is formed over the lower dielectric layer 502 and the thin film resistor 510 and over the protective dielectric layer 516 if present. The upper dielectric layer 522 may include similar materials and be formed by similar processes as the lower dielectric layer 502. The upper dielectric layer 522 may include an optional etch stop layer at a bottom of the upper dielectric layer 522 and/or an optional cap layer at a top surface of the upper dielectric layer 522.

Additional dielectric layers and interconnect elements may be formed in and/or over the upper dielectric layer 522. The process sequence described in reference to FIG. 5A through FIG. 5D may be advantageously be used for integrated circuits formed with single damascene interconnect lines and vias, in which the thin film resistor 510 is desired to be formed on electrodes of vias.

Figure 6:
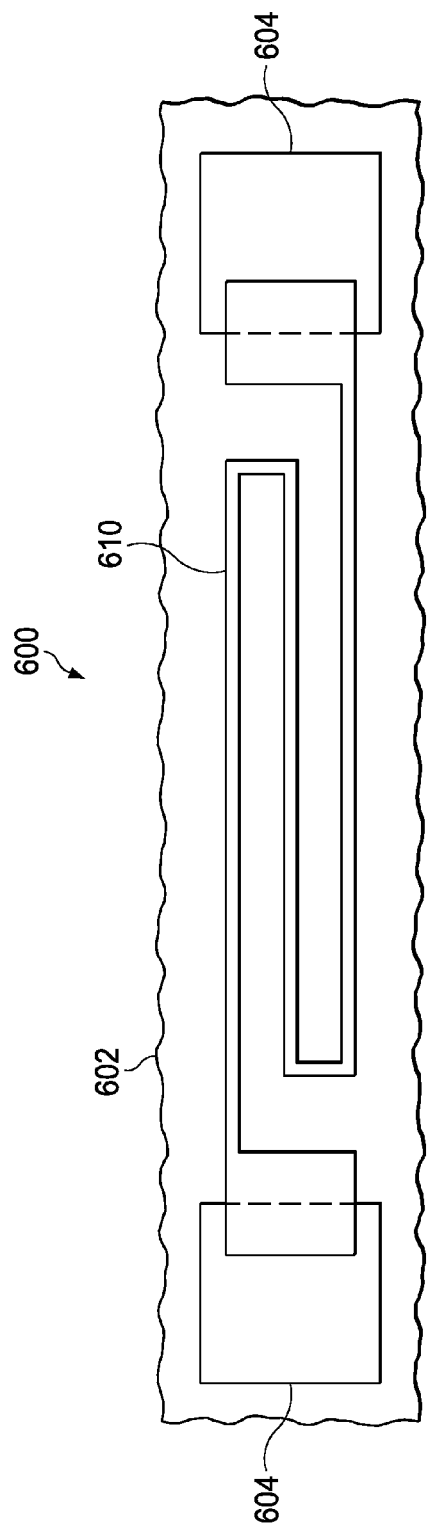
FIG. 6 is a top view of an exemplary integrated circuit containing a thin film resistor.
Figure 7:
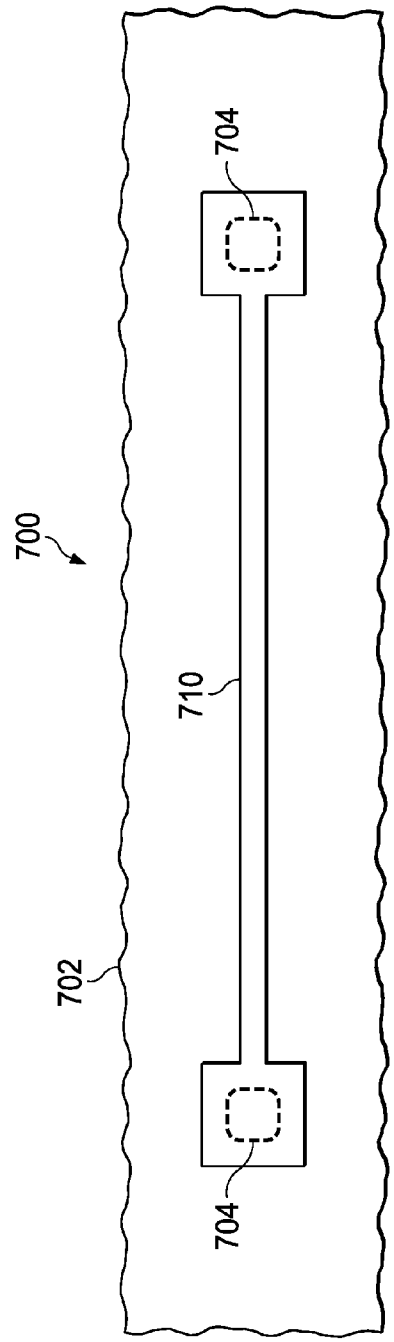
FIG. 7 is a top view of an exemplary integrated circuit containing a thin film resistor.

FIG. 6 and FIG. 7 are top views of exemplary integrated circuits containing thin film resistors. Referring to FIG. 6, the integrated circuit 600 includes a lower dielectric layer 602 and electrodes 604 disposed in the lower dielectric layer 602. A top surface of the electrodes 604 is substantially coplanar with a top surface of the lower dielectric layer 602 between the electrodes 604. A thin film resistor 610 is disposed over the lower dielectric layer 602, partially overlapping the electrodes 604 in the instant example. The thin film resistor 610 makes electrical connections to the top surface of the electrodes 604 at a bottom surface of the thin film resistor 610. A top surface of the thin film resistor 610 is free of electrical connections. In the instant example, the thin film resistor 610 has a serpentine configuration, which may advantageously provide a high resistance in a smaller area compared to a linear configuration. An upper dielectric layer is disposed over the thin film resistor 610 and the lower dielectric layer 602. The upper dielectric layer is not shown in FIG. 6 in order to more clearly show the overlapping nature of the thin film resistor 610 over the electrodes 604.

Referring to FIG. 7, the integrated circuit 700 includes a lower dielectric layer 702 and electrodes 704 disposed in the lower dielectric layer 702. A top surface of the electrodes 704 is substantially coplanar with a top surface of the lower dielectric layer 702 between the electrodes 704. A thin film resistor 710 is disposed over the lower dielectric layer 702 completely overlapping the electrodes 704 in the instant example. The thin film resistor 710 makes electrical connections to the top surface of the electrodes 704 at a bottom surface of the thin film resistor 710. A top surface of the thin film resistor 710 is free of electrical connections. In the instant example, the thin film resistor 710 has a linear configuration, which may advantageously provide a higher power dissipation capacity compared to a serpentine configuration. An upper dielectric layer is disposed over the thin film resistor 710 and the lower dielectric layer 702. The upper dielectric layer is not shown in FIG. 7 in order to more clearly show the overlapping nature of the thin film resistor 710 over the electrodes 704.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming an integrated circuit, comprising the steps of:
    forming a lower dielectric layer above active components of said integrated circuit;
    forming electrodes in said lower dielectric layer, such that top surfaces of said electrodes are substantially coplanar with a top surface of said lower dielectric layer between said electrodes;
    forming a layer of resistor material over said lower dielectric layer and over said electrodes;
    forming a resistor mask over said layer of resistor material which overlaps said electrodes;
    removing said layer of resistor material in areas exposed by said resistor mask to form a thin film resistor, said thin film resistor making electrical connections to said top surfaces of said electrodes at a bottom surface of said thin film resistor; and
    forming an upper dielectric layer over said thin film resistor and said lower dielectric layer, so that a top surface of said thin film resistor is free of electrical connections.

2. The method of claim 1, in which said layer of resistor material comprises a resistive material selected from the group consisting of nickel chromium, silicon chromium and tantalum silicon nitride.

3. The method of claim 1, in which said step of forming said electrodes in said lower dielectric layer comprises steps:
    forming interconnect trenches in said lower dielectric layer;
    forming a metal liner over said lower dielectric layer and extending into said interconnect trenches;
    forming layer of fill metal comprising copper on said metal liner, said layer of fill metal filling said interconnect trenches; and
    removing said fill metal and said metal liner from over said lower dielectric layer, leaving said electrodes in said lower dielectric layer.

4. The method of claim 1, in which said step of forming said electrodes in said lower dielectric layer comprises steps:
    forming via holes in said lower dielectric layer, said via holed exposing electrical connections;
    forming a metal liner over said lower dielectric layer and extending into said via holes;
    forming layer of fill metal on said metal liner, said layer of fill metal filling said via holes; and
    removing said fill metal and said metal liner from over said lower dielectric layer, leaving said electrodes in said lower dielectric layer, said electrodes making contact to said electrical connections.

5. The method of claim 4, in which said layer of fill metal comprises tungsten.

6. The method of claim 4, in which said layer of fill metal comprises copper.

7. A method of forming an integrated circuit, comprising the steps of:
    forming a base dielectric layer above active components of said integrated circuit;
    forming electrodes over said base dielectric layer;
    forming a lower dielectric layer over said base dielectric layer, said lower dielectric layer abutting and surrounding said electrodes, so that top surfaces of said electrodes are substantially coplanar with a top surface of said lower dielectric layer between said electrodes;
    forming a layer of resistor material over said lower dielectric layer and over said electrodes;
    forming a resistor mask over said layer of resistor material which overlaps said electrodes;
    removing said layer of resistor material in areas exposed by said resistor mask to form a thin film resistor, said thin film resistor making electrical connections to said top surfaces of said electrodes at a bottom surface of said thin film resistor; and
    forming an upper dielectric layer over said thin film resistor and said lower dielectric layer, so that a top surface of said thin film resistor is free of electrical connections.

8. The method of claim 7, in which said layer of resistor material comprises a resistive material selected from the group consisting of nickel chromium, silicon chromium and tantalum silicon nitride.

9. The method of claim 7, in which said step of forming said electrodes comprises steps:

forming a layer of interconnect metal over said base dielectric layer, said layer of interconnect metal comprising a layer of aluminum-based metal;

forming an electrode mask over said layer of interconnect metal;

removing said layer of interconnect metal in areas exposed by said electrode mask to form said electrodes; and removing said electrode mask.

10. A method of forming an integrated circuit, comprising the steps of:

forming a lower dielectric layer with electrodes embedded therein using a planarization process that exposes both the lower dielectric layer and the electrodes at a substantially coplanar surface;

forming a layer of resistor material over and touching said lower dielectric layer and over said electrodes;

forming a resistor mask over said layer of resistor material which overlaps said electrodes;

removing said layer of resistor material in areas exposed by said resistor mask to form a thin film resistor, said thin film resistor making electrical connections to said top surfaces of said electrodes at a bottom surface of said thin film resistor; and forming an upper dielectric layer over said thin film resistor and said lower dielectric layer, so that a top surface of said thin film resistor is free of electrical connections.

11. The method of claim 10, further comprising forming head contacts between the electrodes and the thin film resistor.

* * * * *